(12) United States Patent
Brito et al.

(10) Patent No.: US 10,804,900 B2
(45) Date of Patent: Oct. 13, 2020

(54) PAD LIMITED CONFIGURABLE LOGIC DEVICE

(71) Applicant: TEXAS INSTRUMENTS INCORPORATED, Dallas, TX (US)

(72) Inventors: Joao Carlos Brito, Murphy, TX (US); Philip Anthony Coyle, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/107,388

(22) Filed: Aug. 21, 2018

(65) Prior Publication Data
US 2020/0067509 A1    Feb. 27, 2020

(51) Int. Cl.
| | | |
|---|---|---|
| *H03K 19/0175* | (2006.01) | |
| *H01L 23/528* | (2006.01) | |
| *H03K 19/21* | (2006.01) | |
| *H01L 23/495* | (2006.01) | |
| *H01L 23/00* | (2006.01) | |
| *H01L 23/522* | (2006.01) | |

(52) U.S. Cl.
CPC . *H03K 19/017545* (2013.01); *H01L 23/4952* (2013.01); *H01L 23/5226* (2013.01); *H01L 23/5286* (2013.01); *H01L 24/09* (2013.01); *H03K 19/21* (2013.01)

(58) Field of Classification Search
CPC ............ H03K 19/017545; H03K 19/21; H01L 23/5226; H01L 24/09; H01L 23/5286; H01L 23/4952
USPC .......................................................... 326/104
See application file for complete search history.

(56) References Cited

U.S. PATENT DOCUMENTS

| | | | | |
|---|---|---|---|---|
| 6,384,452 B1* | 5/2002 | Chittipeddi | ....... | H01L 21/76264 257/347 |
| 2004/0053142 A1* | 3/2004 | Wang | ........................ | G03F 1/36 430/5 |
| 2004/0061147 A1* | 4/2004 | Fujita | .................... | G06F 11/261 257/232 |

(Continued)

FOREIGN PATENT DOCUMENTS

WO     2018118098 A1    6/2018

OTHER PUBLICATIONS

Texas Instruments 2016 Incorporated, Data Sheet, "SNx4HC00 Quadruple 2-Input Positive-NAND Gates," Revised Jul. 2006.

(Continued)

*Primary Examiner* — Don P Le
(74) *Attorney, Agent, or Firm* — Lawrence J. Bassuk; Charles A. Brill; Frank D. Cimino

(57) ABSTRACT

An integrated circuit provides a semiconductor die with I/O bond pads, a power bond pad, and a circuit ground pad. Each I/O bond pad is associated with an input circuit that has an input circuit output lead. Sets of digital logic functional circuitry on the die provide different digital logic functions. Each function includes logic input leads and logic output leads. Output circuits each have an output circuit in lead and an output circuit out lead. Strapping structures, such as vias, formed in the semiconductor die electrically couple input circuits to a selected set of digital logic functions and the selected set of digital logic functions to output circuit in leads. Upper level metal conductors couple output circuit out leads and selected I/O bond pads.

20 Claims, 21 Drawing Sheets

(56) References Cited

U.S. PATENT DOCUMENTS

| | | | |
|---|---|---|---|
| 2014/0167818 A1 | 6/2014 | Eisenstadt | |
| 2014/0301001 A1* | 10/2014 | Cho | H01L 21/76895 361/56 |
| 2017/0098624 A1* | 4/2017 | Chae | H01L 23/585 |
| 2017/0243874 A1 | 8/2017 | Atsumi et al. | |
| 2017/0271322 A1* | 9/2017 | Russ | H01L 23/367 |
| 2019/0007048 A1 | 1/2019 | Forghani-Zadeh et al. | |

OTHER PUBLICATIONS

Texas Instruments 2015 Incorporated, Data Sheet, "SNx4HC02 Quadruple 2-Input Positive-NOR Gates," Revised Apr. 2015.
Texas Instruments Incorporated, Data Sheet, "SNx4HC08 Quadruple 2-Input Positive-AND Gates," Revised Jun. 2016.
Texas Instruments Incorporated, Data Sheet, 2015 "SNx4HC125 Quadruple Bus Buffer Gates With 2-State Outputs," Revised Dec. 2015.
Texas Instruments Incorporated, Data Sheet, "High-Speed CMOS Logic Quad Buffr, Three-State," Revised Sep. 2003.
Texas Instruments Incorporated, Data Sheet, "SNx4HC32 Quadruple 2-Input Positive OR-Gates," Revised Jul. 2016.
Texas Instruments Incorporated, Data Sheet, "SN54HC86, SN74HC86 Quadruple 2-Input Exclusive-OR Gates," Revised Aug. 2003.
Texas Instruments Incorporated, Data Sheet, "High Speed CMOS Logic Quad 2-Input Exclusive NOR Gate," Revised Sep. 2003.
Texas Instruments Incorporated, Data Sheet, "SNx4HC74 Dual D-Type Positive-Edge-Triggered Flip-Flops With Clear and Preset," Revised Dec. 2015.
Texas Instruments Incorporated, Data Sheet, "SNx4HC04 Hex Inverters," Revised Sep. 2015.
Texas Instruments Incorporated, Data Sheet, "SNx4HC05 Hex Inverters With Open-Drain Outputs," Revised Mar. 2015.
Texas Instruments Incorporated, Data Sheet, "Triple 3-Input Positive-NAND Gates," Revised Aug. 2003.
Texas Instruments Incorporated, Data Sheet, "High-Speed CMOS Logic Triple 3-Input AND Gate," Revised Sep. 2003.
Texas Instruments Incorporated, Data Sheet, "High-Speed CMOS Logic Triple 3-Input NOR Gate," Revised Sep. 2003.
Texas Instruments Incorporated, Data Sheet, "Quadruple Positive-NOR Gates With Schmitt-Trigger Inputs," Revised Nov. 2004.
Texas Instruments Incorporated, Data Sheet, "Quadruple 2-Input Positive-NAND Gates With Open-Drain Outputs," Revised Nov. 2003.
PCT Search Report dated Oct. 31, 2019.

* cited by examiner

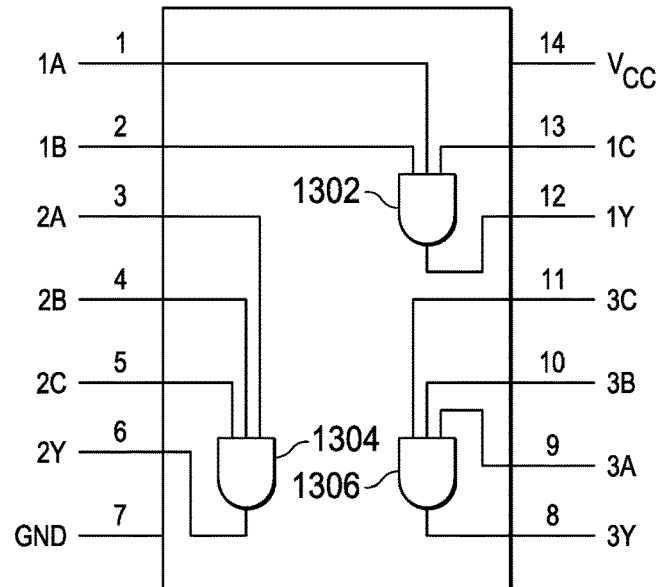 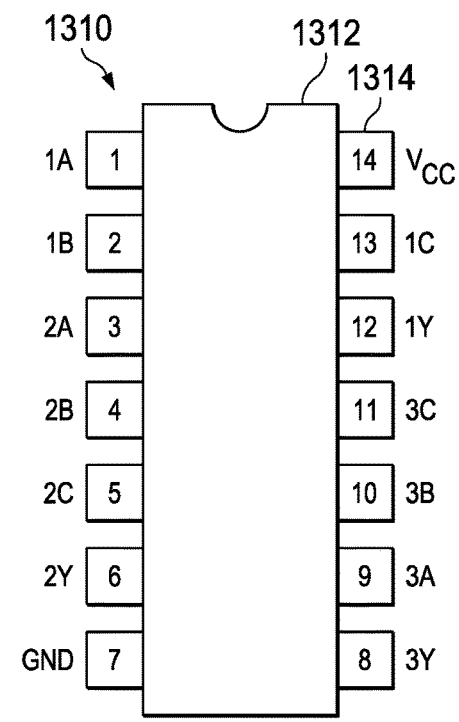
FIG. 13A    FIG. 13B
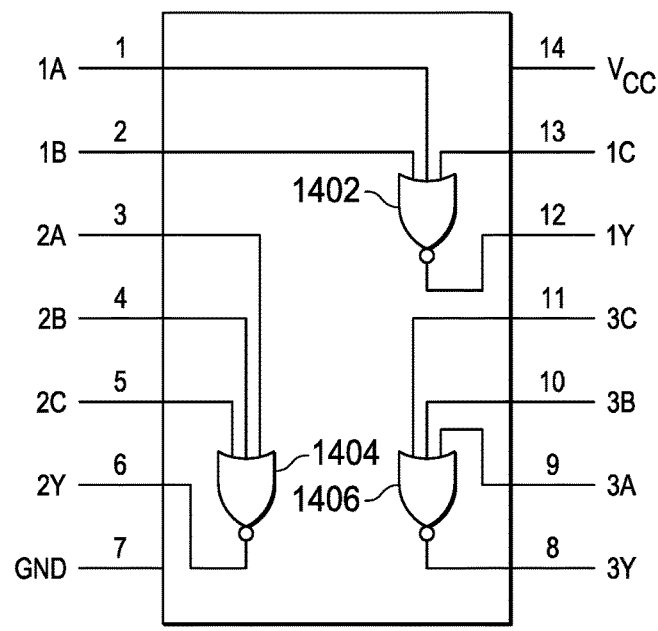 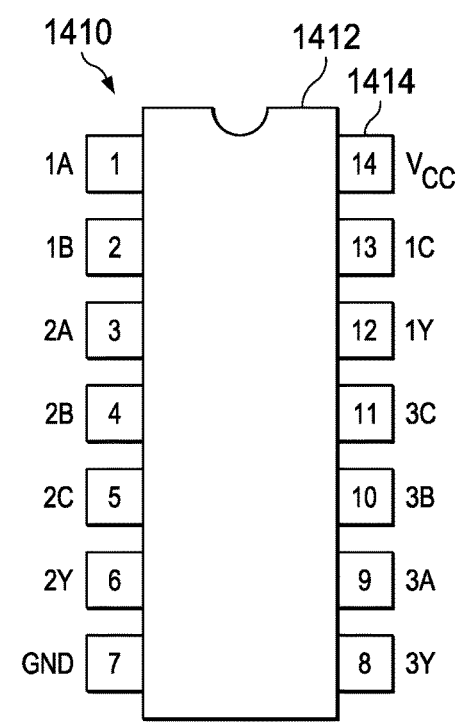
FIG. 14A    FIG. 14B

PAD LIMITED CONFIGURABLE LOGIC DEVICE

CROSS-REFERENCE TO RELATED APPLICATIONS

This application is related to U.S. application Ser. No. 15/635,998, filed Jun. 28, 2017 and that application in its entirety is expressly incorporated by reference in this application.

BACKGROUND OF THE DISCLOSURE

Standard, digital logic, integrated circuit or IC logic families were among the first IC parts designed and developed in the 1960s and now provide hundreds of different parts and specifications. Digital logic circuits provide basic Boolean logical functions such as an inverter, AND, NAND, OR, NOR, Exclusive OR or XOR. Digital logic circuits also provide complex functions, such as flip flops, multiplexers, demultiplexers, line buffers, and line drivers.

Over time families of standard logic ICs were designed and developed with increasingly complex manufacturing processes, multiple logical functions, multiple different voltage, current, and timing specifications, and multiple different encapsulated packages.

Many of these logic ICs were originally designed and developed by large design teams, one part by one part, over a span of decades in the then current process technology. This design method made business sense in the early stages of the semiconductor era. However, since these logic families have become commoditized, generating new logic families with this old approach is not financially feasible.

Further, the multiple characteristics or specifications of logic ICs slow the delivery of logic ICs to customers or require a large inventory of logic ICs. Without an inventory of multiple logic ICs, a new customer order for specific logic ICs must be placed in the manufacturing cue with earlier orders and then wait for manufacture of a new batch of logic ICs, which slows delivery to a customer. Alternatively, completely finished and tested ICs can be available to immediately fill a customer order, but require substantial inventory of multiple ICs with multiple different specification waiting to fill unknown orders that may never occur, which is costly.

The inventory versus customer delivery time problem is accentuated by the large number of families of logic ICs and the large number of logic functions available in each family. These families provide multiple different electrical specifications, such as supply voltages, bipolar, CMOS, and BiCMOS technologies, overvoltage tolerant inputs, different input specifications, different output drive specifications, live insertion capabilities, and input to output propagation delays. Each family can also provide multiple logic functions, such as buffers/line drivers, flip flops, combination logic, counters, shift registers, encoders/multiplexers, decoders/demultiplexers, gates, transceivers, level translators, phase lock loops, and bus switches.

Reducing the cost of existing and new logic devices while maintaining current electrical specifications would be desirable.

BRIEF SUMMARY OF THE DISCLOSURE

An electronic device includes packaging material having an external surface. Fourteen external terminals are exposed to the external surface. An integrated circuit is formed on a semiconductor die. The integrated circuit and semiconductor die are encapsulated in the packaging material and the fourteen external terminals are connected to fourteen bond pads on the semiconductor die with bond wires or other conductors. Each of the bond pads has a minimum area on the semiconductor die.

One of the bond pads is a power bond pad for circuit power, and another bond pad is a ground bond pad for circuit ground.

The other twelve bond pads are for functional input and output signals. In this disclosure, reference to a bond pad generally refers to the bond pads for functional input and output signals.

The power bond pad and the twelve bond pads each overlie an electrostatic discharge circuit for that bond pad.

The semiconductor die has one input circuit for each bond pad. Each input circuit has an input lead coupled to one bond pad and has an output lead.

Core circuitry provides several sets of digital logic circuits with each set providing a different digital logic function on the semiconductor die. Each set of digital logic circuits or functions provides a limited number of the same logical functions, such as four logical gates, six inverters, six buffers, and two flip flops.

The disclosed sets of digital logic circuits or functions in the core circuitry include a set of four, two input NAND gates; a set of four, two input NOR gates; a set of four, two input AND gates; a set of four, bus buffer gates with 3-state outputs; a set of four, bus buffers with 3-state outputs; a set of four, two input OR gates; a set of four, two input XOR gates; a set of four, two input XNOR gates; a set of two, D-type flip flops; hex inverters; a set of hex inverters with open drains; a set of six inverters; a set of three, three input NAND gates; a set of three, three input AND gates; a set of three, three input NOR gates; a set of four, two input NOR gates with Schmitt-trigger inputs; and a set of four, 2 input NAND gates with open drain outputs.

The core circuitry includes a logic input lead and a logic output lead for each of the inputs and outputs of the digital logic functions. A logic input lead can be coupled to an input circuit output lead.

Six output circuits each have an output circuit in lead and an output circuit out lead. An output circuit in lead can be coupled to a logic output lead of a selected digital logic function and an output circuit out lead can be coupled to a selected bond pad as needed by the configuration of the electronic device.

First conductive leads are connected to the input circuit output leads. Second conductive leads are adjacent the first conductive leads and are connected to the logic input leads.

Third conductive leads are connected to the logic output leads. Fourth conductive leads are adjacent the third conductive leads and are connected to the output circuit in leads.

Vias connect together configured first and second conductive leads, and connect together configured third and fourth conductive leads, and fifth conductive leads are connected to the output circuit out leads and to the bond pads, as needed by the configuration of the electronic device.

BRIEF DESCRIPTION OF THE VIEWS OF THE DRAWINGS

FIGS. 13A and 13B respectively are symbols for three, three input AND gates and a plan view representation of an encapsulated integrated circuit providing a set of three, three input AND gates.

FIGS. 14A and 14B respectively are symbols for three, three input NOR gates and a plan view representation of an encapsulated integrated circuit providing a set of three, three input NOR gates.

DETAILED DESCRIPTION OF THE DISCLOSURE

Figure 1A:
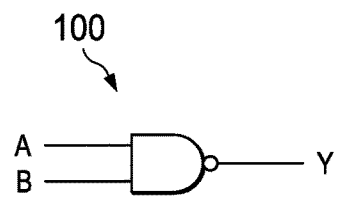
FIGS. 1A and 1B respectively are a symbol for a two input NAND gate and a plan view representation of an encapsulated integrated circuit providing a set of four, two input NAND gates.

The description in this specification has been prepared for a person skilled in this art and omits many process and structural details not necessary for understanding the disclosure. The drawings in the figures are abstract, high level representations of semiconductor dies implementing gates and flip flop logic functions. The drawings intentionally omit details of implementation, such as the multiple levels of individual transistors and their fabrication in a semiconductor die, to simplify the description and facilitate understanding of the disclosure. A person skilled in this art would understand the description of these abstract representations and understand the omission of more detailed structures or elements in the following description of the disclosure.

An actual implementation of an integrated circuit on a semiconductor die disclosed in this specification would be quite small and difficult to image. The accompanying drawings are necessarily great enlargements of the actual semiconductor dies that they represent and do not intend to depict all of the well-known individual circuits present in such an integrated circuit.

The word "connect" may or may not mean a direct connection with no intervening circuits. The word "couple" may infer that described, or other understood not described, structure may exist between the "coupled" elements The problem of inventory and customer delivery time can be addressed with more efficiency using a master design for a group of digital logic functions in early semiconductor processing steps and differentiated late processing steps for the separate logic functions. The late processing steps can be the use of upper metal level layer leads interconnected with such as vias to configure a desired logic function from the group of logic functions available in the master design.

One consideration in achieving such an advance in the technology is reducing the large number of known logic function parts into a smaller, first group of logic functions that can be implemented in one master design and be differentiated in late processing steps. This consideration includes selecting a limited group of logic functions that have the same mechanical specification for the number of package pins and that have compatible electrical and timing specifications for operation, inputs, and outputs.

Another consideration in achieving such an advance is realizing that the size of a master die, implementing a master design for the first group of logic functions, will be limited by the number and size of bond pads formed on the master die. The number of bond pads is influenced by the number of inputs and the number of outputs for the logic functions of the first group, plus bond pads for power and circuit ground. The minimum size of the bond pads is limited by the assembly manufacturability of the master die in a package. With the number of bond pads influenced by the logic functions of the first group, a semiconductor die area is substantially determined by the area required for the bond pads.

Another consideration is arranging the circuits on the master die. In this regard, one way to use the die area efficiently is to locate the electrostatic discharge (ESD) protection circuits for the inputs and outputs under the bond pads. With this arrangement of bond pads and ESD circuits, the functional logic circuits can be centrally located on the master die. Connecting leads and configuration structures, such as vias, can be located between the bond pads and the centrally located functional logic.

Within these considerations, a non-limiting example of sets of known logic function parts to be implemented in a master die could include the sets of logic functions described in the following paragraphs.

Figure 1B:
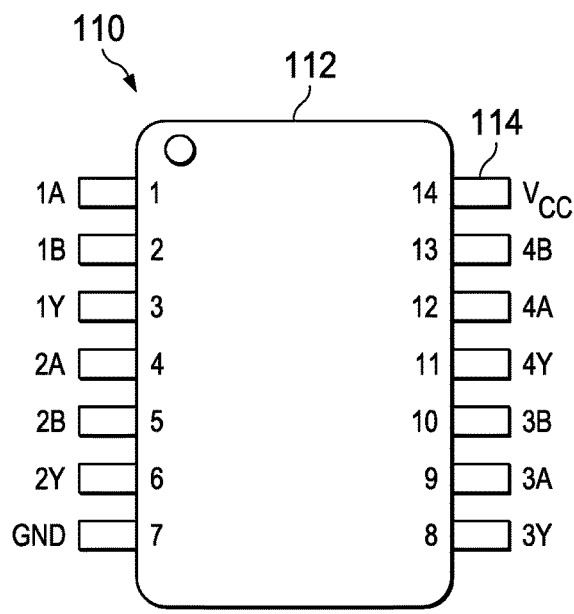

FIGS. 1A and 1B, respectively, depict a symbol for a NAND gate inverter 100 and a plan view representation of an encapsulated, quad NAND gate integrated circuit (IC) 110. NAND gate 100 has an A input lead, a B input lead, and a Y output lead.

IC 110 has a package body 112 and 14 pins or terminals 114 numbered 1 through 14. Pin 1 is identified as input 1A, pin 2 is identified as input 1B, and pin 3 is identified as output 1Y. Pins 1, 2, and 3 provide the inputs and output of a first NAND gate. Pin 4 is identified as input 2A, pin 5 is identified as input 2B, and pin 6 is identified as output 2Y. Pins 4, 5, and 6 provide the inputs and output of a second NAND gate. Pin 7 provides a connection to circuit ground GND. Pin 8 is identified as output 3Y, pin 9 is identified as input 3A, and pin 10 is identified as input 3B. Pins 8, 9, and 10 provide the output and inputs of a third NAND gate. Pin 11 is identified as output 4Y, pin 12 is identified as input 4A, and pin 13 is identified as input 4B. Pins 11, 12, and 13 provide the output and inputs of a fourth NAND gate. Pin 14 provides a connection to Vcc or circuit power.

An example of IC 110 is part number SN54HC00, SN74HC00, Quadruple 2-Input Positive-NAND Gates from Texas Instruments Incorporated.

Figure 2A:
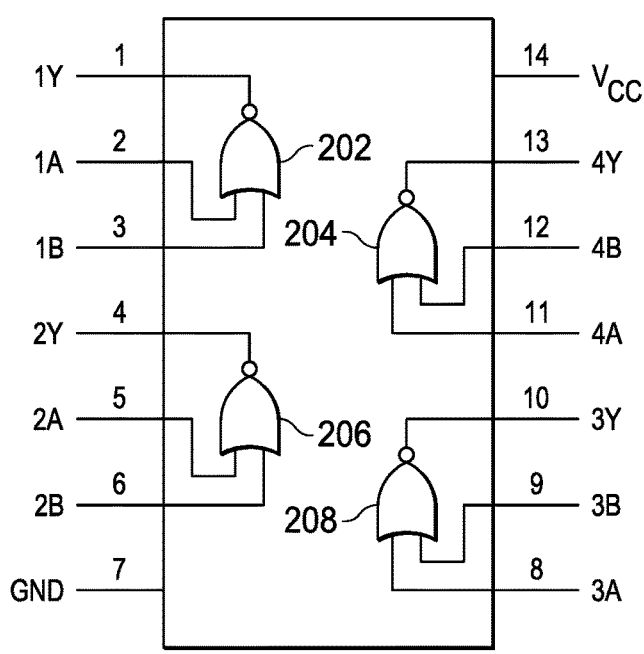
FIGS. 2A and 2B respectively are symbols for a four, two input NOR gates and a plan view representation of an encapsulated integrated circuit providing a set of four, two input NOR gates.
Figure 2B:
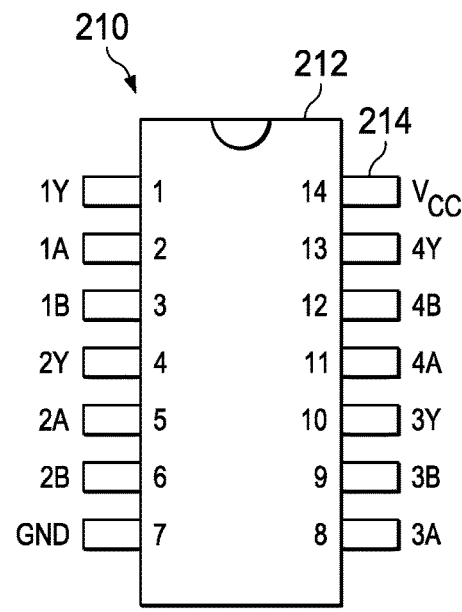

FIGS. 2A and 2B, respectively, depict symbols for four, two input NOR gates 202, 204, 206, and 208, and a plan view representation of an encapsulated, quad NOR gate integrated circuit 210. Each of NOR gates 202, 204, 206 and 208 has an A input, a B input and a Y output.

IC 210 has a package body 212 and 14 pins or terminals 214 numbered 1 through 14. Pin 1 is identified as output 1Y, pin 2 is identified as input 1A, and pin 3 is identified as input 1B. Pins 1, 2, and 3 provide the output and inputs of a first NOR gate. Pin 4 is identified as output 2Y, pin 5 is identified as input 2A, and pin 6 is identified as input 2B. Pins 4, 5, and 6 provide the output and inputs of a second NOR gate. Pin 7 provides a connection to circuit ground GND. Pin 8 is identified as input 3A, pin 9 is identified as input 3B, and pin 10 is identified as output 3Y. Pins 8, 9, and 10 provide the inputs and output of a third NOR gate. Pin 11 is identified as input 4A, pin 12 is identified as input 4B, and pin 13 is identified as output 4Y. Pins 11, 12, and 13 provide the inputs and output of a fourth NOR gate. Pin 14 provides a connection to Vcc or circuit power.

An example of IC 210 is part number SN54HC02, SN74HC02, Quadruple 2-Input Positive-NOR Gates from Texas Instruments Incorporated.

Figure 3A:
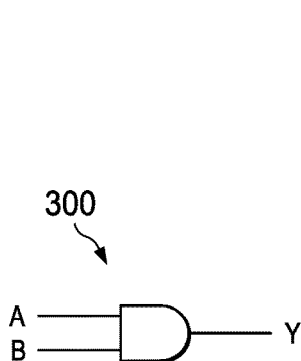
FIGS. 3A and 3B respectively are a symbol for a two input AND gate and a plan view representation of an encapsulated integrated circuit providing a set of four, two input AND gates.
Figure 3B:
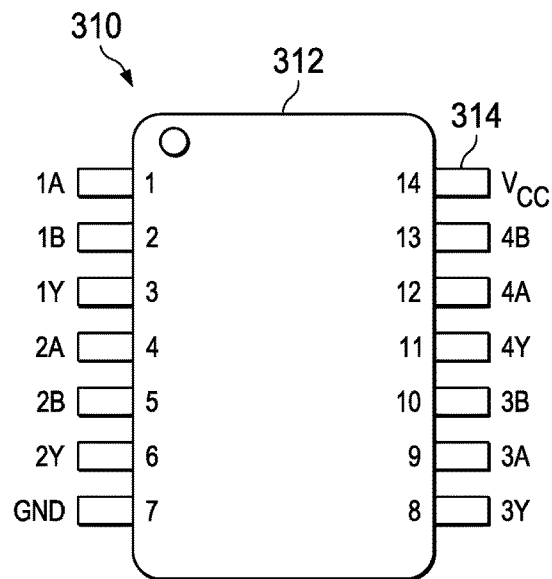

FIGS. 3A and 3B, respectively, depict a symbol for an AND gate 300 and a plan view representation of an encapsulated, quad AND gate integrated circuit 310. AND gate 300 has an A input, a B input, and a Y output.

IC 310 has a package body 312 and 14 pins or terminals 314 numbered 1 through 14. Pin 1 is identified as input 1A, pin 2 is identified as input 1B, and pin 3 is identified as output 1Y. Pins 1, 2, and 3 provide the inputs and output of a first AND gate. Pin 4 is identified as input 2A, pin 5 is identified as input 2B, and pin 6 is identified as output 2Y. Pins 4, 5, and 6 provide the inputs and output of a second AND gate. Pin 7 provides a connection to circuit ground GND. Pin 8 is identified as output 3Y, pin 9 is identified as input 3A, and pin 10 is identified as input 3B. Pins 8, 9, and 10 provide the output and inputs of a third AND gate. Pin 11 is identified as output 4Y, pin 12 is identified as input 4A, and pin 13 is identified as input 4B. Pins 11, 12, and 13 provide the output and inputs of a fourth AND gate. Pin 14 provides a connection to Vcc or circuit power.

An example of IC 310 is part number SN54HC08, SN74HC08, Quadruple 2-Input Positive-AND Gates from Texas Instruments Incorporated.

Figure 4A:
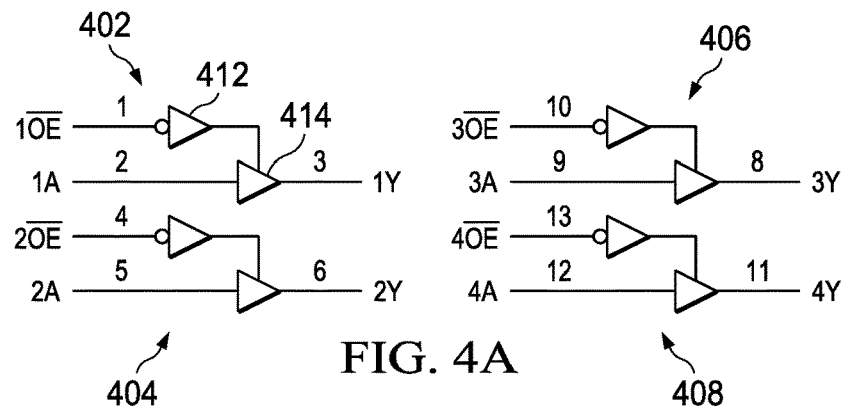
FIGS. 4A and 4B respectively are symbols for a set of four, bus buffer gates with 3-state outputs and a plan view representation of an encapsulated integrated circuit providing a set of four, bus buffer gates with 3-state outputs.
Figure 4B:
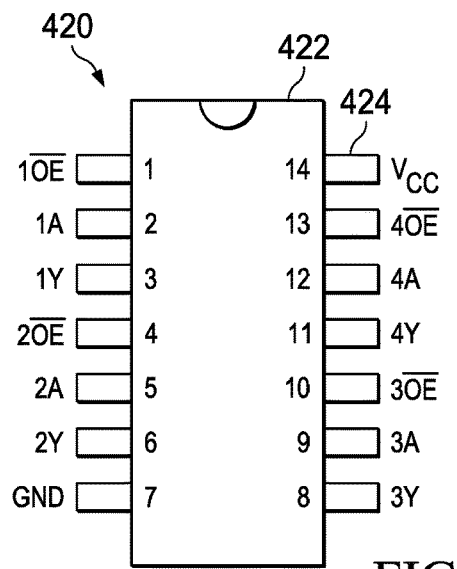

FIGS. 4A and 4B, respectively, depict a symbol for four bus buffer gates with 3-state outputs 402, 404, 406, and 408, and a plan view representation of an encapsulated, quad bus buffer gates integrated circuit 420. Each bus buffer gate 402, 404, 406, and 408 has an inverter 412 having an output enable OE_input, and an output, and a buffer 414 with a 3-state enable input connected to the output of inverter 412, an A input, and a Y output.

IC 420 has a package body 422 and 14 pins or terminals 424 numbered 1 through 14. Pin 1 is identified as input 1OE_, pin 2 is identified as input 1A, and pin 3 is identified as output 1Y. Pins 1, 2, and 3 provide the inputs and output of a first bus buffer gate. Pin 4 is identified as input 2OE_, pin 5 is identified as input 2A, and pin 6 is identified as output 2Y. Pins 4, 5, and 6 provide the inputs and output of a second bus buffer gate. Pin 7 provides a connection to circuit ground GND. Pin 8 is identified as output 3Y, pin 9 is identified as input 3A, and pin 10 is identified as input 3OE_. Pins 8, 9, and 10 provide the output and inputs of a third bus buffer gate. Pin 11 is identified as output 4Y, pin 12 is identified as input 4A, and pin 13 is identified as input 4OE_. Pins 11, 12, and 13 provide the output and inputs of a fourth bus buffer gate. Pin 14 provides a connection to Vcc or circuit power.

An example of IC 410 is part number SN54HC125, SN74HC125, Quadruple Bus Buffer Gates With 3-State Outputs from Texas Instruments Incorporated.

Figure 5A:
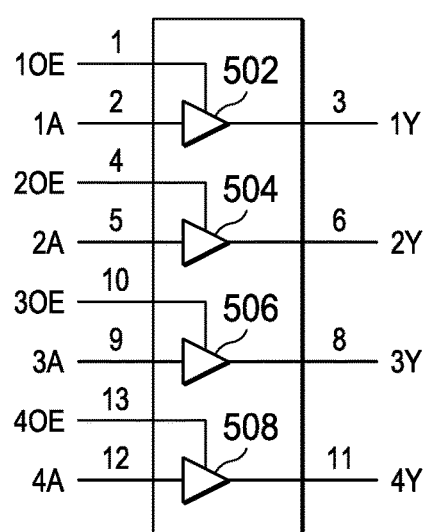
FIGS. 5A and 5B respectively are symbols for a set of four, 3-state buffers and a plan view representation of an encapsulated integrated circuit providing a set of four, 3-state buffers.
Figure 5B:
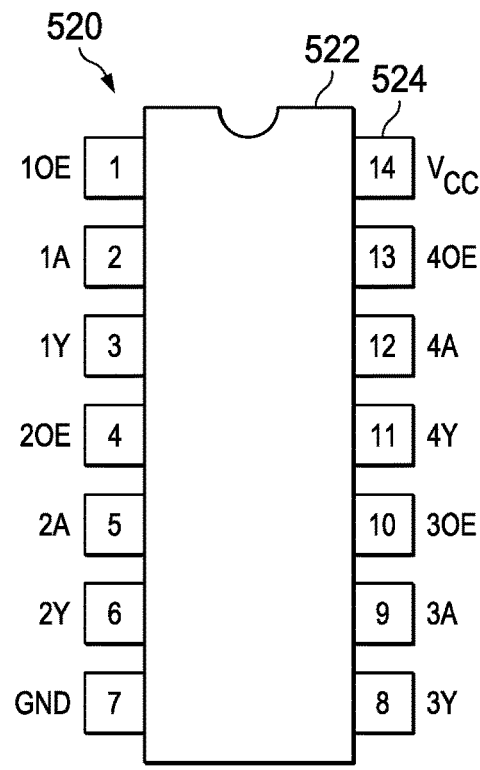

FIGS. 5A, and 5B, respectively depict symbols for four buffers with 3-state outputs 502, 504, 506, and 508 and a plan view representation of an encapsulated, quad bus buffers integrated circuit 520. Each bus buffer 502, 504, 506, and 508 has a 3-state enable input OE, an A input, and a Y output.

IC 520 has a package body 522 and 14 pins or terminals 524 numbered 1 through 14. Pin 1 is identified as input 1OE, pin 2 is identified as input 1A, and pin 3 is identified as output 1Y. Pins 1, 2, and 3 provide the inputs and output of a first bus buffer. Pin 4 is identified as input 2OE, pin 5 is identified as input 2A, and pin 6 is identified as output 2Y. Pins 4, 5, and 6 provide the inputs and output of a second bus buffer. Pin 7 provides a connection to circuit ground GND. Pin 8 is identified as output 3Y, pin 9 is identified as input 3A, and pin 10 is identified as input 3OE. Pins 8, 9, and 10 provide the output and inputs of a third bus buffer. Pin 11 is identified as output 4Y, pin 12 is identified as input 4A, and pin 13 is identified as input 4OE. Pins 11, 12, and 13 provide the output and inputs of a fourth bus buffer. Pin 14 provides a connection to Vcc or circuit power.

An example of IC 510 is part number SN54HC126, SN74HC126, Quad Buffer With 3-State Outputs from Texas Instruments Incorporated.

Figure 6A:
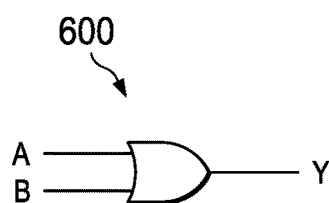
FIGS. 6A and 6B respectively are a symbol for a two input OR gate and a plan view representation of an encapsulated integrated circuit providing a set of four, two input OR gates.
Figure 6B:
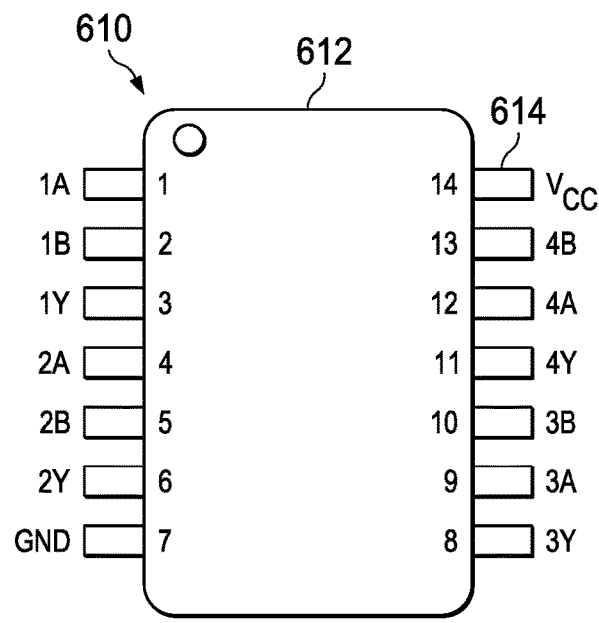

FIGS. 6A and 6B, respectively, depict a symbol for an OR gate 600 and a plan view representation of an encapsulated, quad OR gate integrated circuit 610. OR gate 600 has an A input, a B input and a Y output.

IC 610 has a package body 612 and 14 pins or terminals 614 numbered 1 through 14. Pin 1 is identified as input 1A, pin 2 is identified as input 1B, and pin 3 is identified as output 1Y. Pins 1, 2, and 3 provide the inputs and output of a first OR gate. Pin 4 is identified as input 2A, pin 5 is identified as input 2B, and pin 6 is identified as output 2Y. Pins 4, 5 and 6 provide the inputs and output of a second OR gate. Pin 7 provides a connection to circuit ground GND. Pin 8 is identified as output 3Y, pin 9 is identified as input 3A, and pin 10 is identified as input 3B. Pins 8, 9, and 10 provide the output and inputs of a third OR gate. Pin 11 is identified as output 4Y, pin 12 is identified as input 4A, and pin 13 is identified as input 4B. Pins 11, 12, and 13 provide the output and inputs of a fourth OR gate. Pin 14 provides a connection to Vcc or circuit power.

An example of IC 610 is part number SN54HC32, SN74HC32, Quadruple 2-Input Positive-Or Gates from Texas Instruments Incorporated.

Figure 7A:
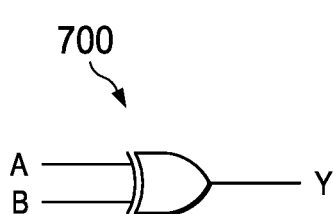
FIGS. 7A and 7B respectively are a symbol for a two input EXCLUSIVE OR gate and a plan view representation of an encapsulated integrated circuit providing a set of four, two input EXCLUSIVE OR gates.
Figure 7B:
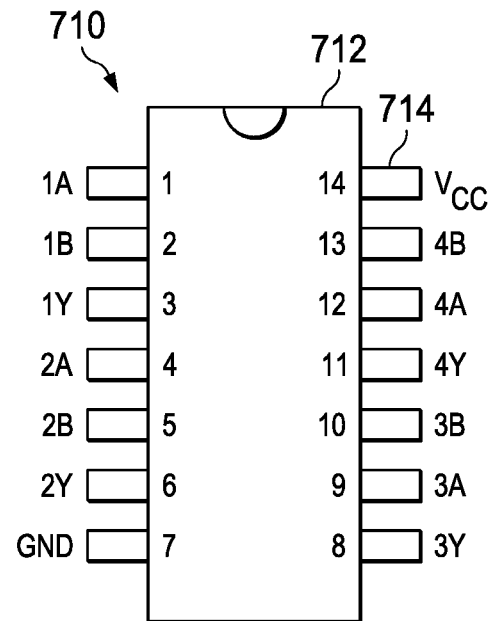

FIGS. 7A and 7B, respectively, depict a symbol for an XOR gate 700 and a plan view representation of an encapsulated, quad XOR gate integrated circuit 710. XOR gate 600 has an A input, a B input and a Y output.

IC 710 has a package body 712 and 14 pins or terminals 714 numbered 1 through 14. Pin 1 is identified as input 1A, pin 2 is identified as input 1B, and pin 3 is identified as output 1Y. Pins 1, 2, and 3 provide the inputs and output of a first XOR gate. Pin 4 is identified as input 2A, pin 5 is identified as input 2B, and pin 6 is identified as output 2Y. Pins 4, 5 and 6 provide the inputs and output of a second XOR gate. Pin 7 provides a connection to circuit ground GND. Pin 8 is identified as output 3Y, pin 9 is identified as input 3A, and pin 10 is identified as input 3B. Pins 8, 9, and 10 provide the output and inputs of a third XOR gate. Pin 11 is identified as output 4Y, pin 12 is identified as input 4A, and pin 13 is identified as input 4B. Pins 11, 12, and 13 provide the output and inputs of a fourth XOR gate. Pin 14 provides a connection to Vcc or circuit power.

An example of IC 710 is part number SN54HC86, SN74HC86, Quadruple 2-Input Exclusive-OR Gates from Texas Instruments Incorporated.

Figure 8A:
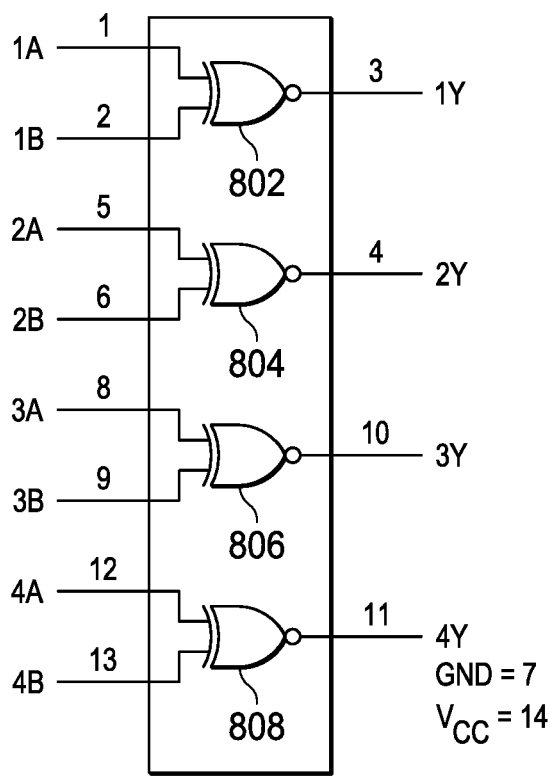
FIGS. 8A and 8B respectively are symbols for a four, two input EXCLUSIVE NOR gates and a plan view representation of an encapsulated integrated circuit providing a set of four, two input EXCLUSIVE NOR gates.
Figure 8B:
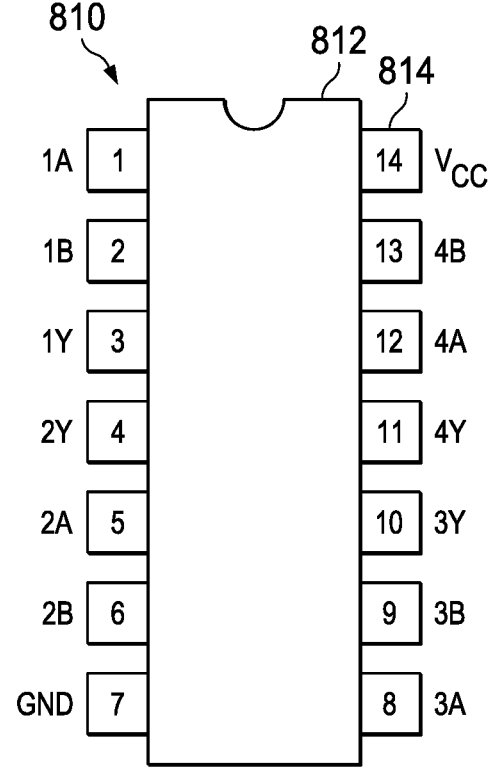

FIGS. 8A and 8B, respectively, depict symbols for four, two input XNOR gates 802, 804, 806, and 808, and a plan view representation of an encapsulated, quad XNOR gate integrated circuit 210. Each of XNOR gates 802, 804, 806 and 808 has an A input, a B input and a Y output.

IC 810 has a package body 812 and 14 pins or terminals 814 numbered 1 through 14. Pin 1 is identified as input 1A, pin 2 is identified as input 1B, and pin 3 is identified as output 1Y. Pins 1, 2, and 3 provide the inputs and output of a first XNOR gate. Pin 4 is identified as output 2Y, pin 5 is identified as input 2A, and pin 6 is identified as input 2B. Pins 4, 5, and 6 provide the output and inputs of a second XNOR gate. Pin 7 provides a connection to circuit ground GND. Pin 8 is identified as input 3A, pin 9 is identified as input 3B, and pin 10 is identified as output 3Y. Pins 8, 9, and 10 provide the output and inputs of a third XNOR gate. Pin 11 is identified as output 4Y, pin 12 is identified as input 4A, and pin 13 is identified as input 4B. Pins 11, 12, and 13 provide the output and inputs of a fourth XNOR gate. Pin 14 provides a connection to Vcc or circuit power.

An example of IC 610 is part number SN54HC32, SN74HC32, Quadruple 2-Input Exclusive-NOR Gates from Texas Instruments Incorporated.

Figure 9A:
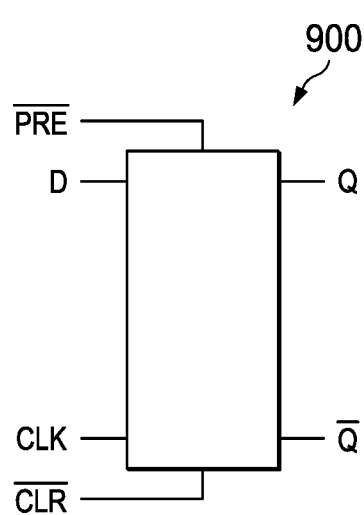
FIGS. 9A and 9B respectively are a schematic diagram of a D-type flip flop and a plan view representation of an encapsulated integrated circuit providing a set of two D-type flip flops.
Figure 9B:
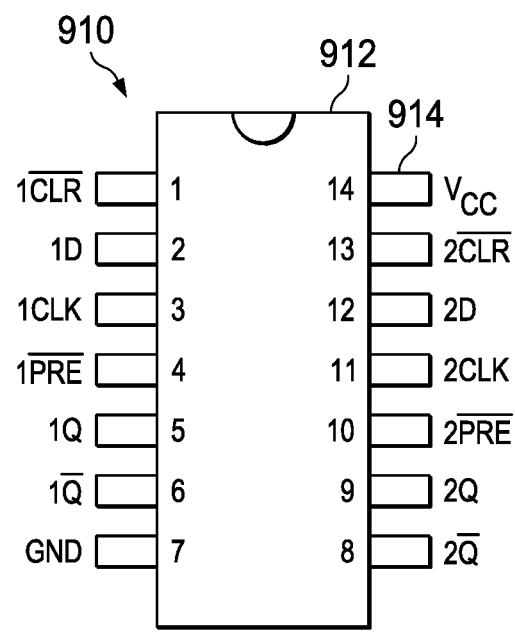

FIGS. 9A and 9B, respectively, depict a symbol for a D-type flip flop 900, and a plan view representation of an encapsulated, dual D-type flip flops with clear and preset integrated circuit 910. Each flip flop 900 has a D input, a CLK or clock input, a PRE_ or preset_ input, a CLR_ or clear input, a Q output, and a Q_ output.

IC 910 has a package body 912 and 14 pins or terminals 914 numbered 1 through 14. Pin 1 is identified as input 1CLR_, pin 2 is identified as input 1D, pin 3 is identified as input 1CLK, pin 4 is identified as input 1PRE_, pin 5 is identified as output 1Q, and pin 6 is identified as output 1Q_. Pins 1, 2, 3, 4, 5, and 6 provide the inputs and outputs of a first D-type flip flop. Pin 7 provides a connection to circuit ground GND. Pin 8 is identified as output 2Q_, pin 9 is identifies as output 2Q, pin 10 is identified as input 2PRE_, pin 11 is identified as input 2CLK, pin 12 is identified as input 2D, and pin 13 is identified as input 2CLR_. Pins 8, 9, 10, 11, 12, and 13 provide the outputs and inputs of a second D-type flip flop. Pin 14 provides a connection to Vcc or circuit power.

An example of IC 910 is part number SN54HC74, SN74HC74, Dual D-Type Positive-Edge-Triggered Flip Flops With Clear And Preset from Texas Instruments Incorporated.

Figure 10A:
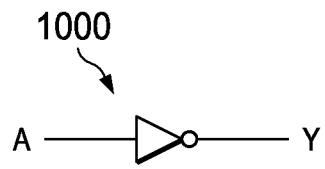
FIGS. 10A and 10B respectively are a symbol for an INVERTER and a plan view representation of an encapsulated integrated circuit providing a set of six INVERTERS.
Figure 10B:
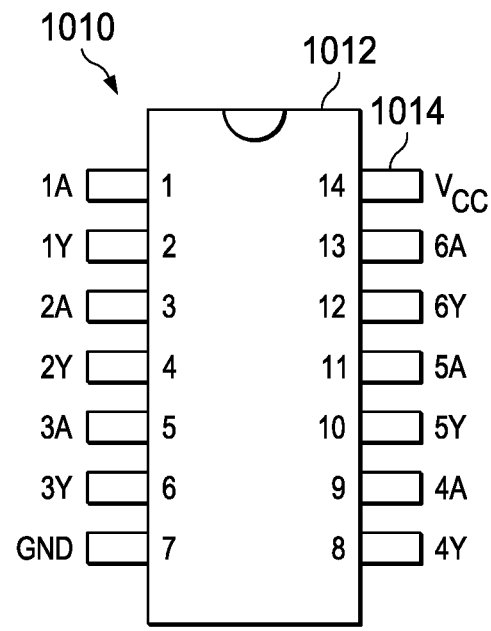

FIGS. 10A and 10B, respectively, depict a symbol for an inverter 1000 and a plan view representation of an encapsulated, hex inverters integrated circuit 1010. Inverter 1000 has an A input and a Y output.

IC 1010 has a package body 1012 and 14 pins or terminals 1014 numbered 1 through 14. Pin 1 is identified as input 1A, pin 2 is identified as output 1Y. Pins 1 and 2 provide the input and output of a first inverter. Pin 3 is identified as input 2A, pin 4 is identified as output 2Y. Pins 3 and 4 provide the input and output of a second inverter. Pin 5 is identified as input 3A, pin 6 is identified as output 3Y. Pins 5 and 6 provide the input and output of a third inverter. Pin 7 provides a connection to circuit ground GND. Pin 8 is identified as output 4Y, pin 9 is identified as input 4A. Pins 8 and 9 provide the output and input of a fourth inverter. Pin 10 is identified as output 5Y, pin 11 is identified as input 5A. Pins 10 and 11 provide the output and input of a fifth inverter. Pin 12 is identified as output 6Y, pin 13 is identified as input 6A. Pins 12 and 13 provide the output and input of a sixth inverter. Pin 14 provides a connection to Vcc or circuit power.

An example of IC 1010 is part number SN54HC04, SN74HC04, Hex Inverters from Texas Instruments Incorporated.

Figure 11A:
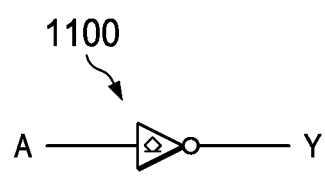
FIGS. 11A and 11B respectively are a symbol for an INVERTER with an open drain output and a plan view representation of an encapsulated integrated circuit providing a set of six INVERTERS with open drain outputs.
Figure 11B:
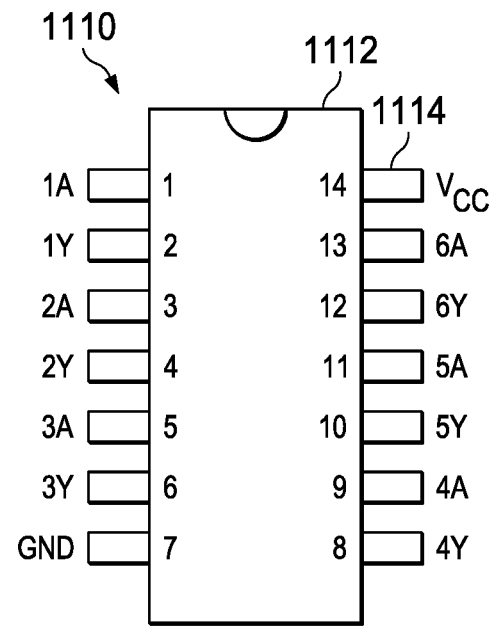

FIGS. 11A and 11B, respectively, depict a symbol for an inverter with an open drain outputs 1100 and a plan view representation of an encapsulated, hex inverters with open drain outputs integrated circuit 1110. Inverter 1100 has an A input and a Y output with an open drain output.

IC 1110 has a package body 1112 and 14 pins or terminals 1114 numbered 1 through 14. Pin 1 is identified as input 1A, pin 2 is identified as output 1Y. Pins 1 and 2 provide the input and output of a first inverter. Pin 3 is identified as input 2A, pin 4 is identified as output 2Y. Pins 3 and 4 provide the input and output of a second inverter. Pin 5 is identified as input 3A, pin 6 is identified as output 3Y. Pins 5 and 6 provide the input and output of a third inverter. Pin 7 provides a connection to circuit ground GND. Pin 8 is identified as output 4Y, pin 9 is identified as input 4A. Pins 8 and 9 provide the output and input of a fourth inverter. Pin 10 is identified as output 5Y, pin 11 is identified as input 5A. Pins 10 and 11 provide the output and input of a fifth inverter. Pin 12 is identified as output 6Y, pin 13 is identified as input 6A. Pins 12 and 13 provide the output and input of a sixth inverter. Pin 14 provides a connection to Vcc or circuit power.

An example of IC 1110 is part number SN54HC05, SN74HC05, Hex Inverters With Open-Drain Outputs from Texas Instruments Incorporated.

Figure 12A:
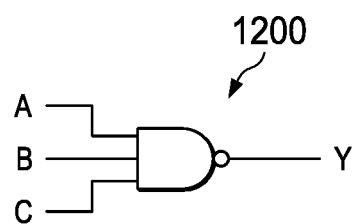
FIGS. 12A and 12B respectively are a symbol for a three input NAND gate and a plan view representation of an encapsulated integrated circuit providing a set of three, three input NAND gates.
Figure 12B:
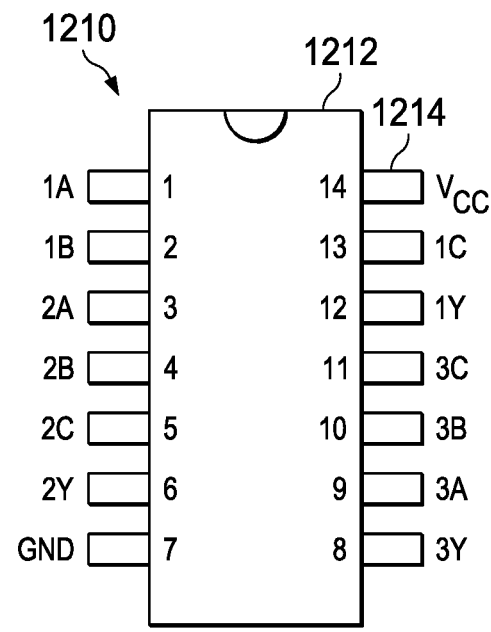

FIGS. 12A and 12B, respectively, depict a symbol for a three input NAND gate 1200 and a plan view representation of an encapsulated, triple 3-input NAND gates integrated circuit 1210. NAND gate 1200 has an A input, a B input, a C input, and a Y output.

IC 1210 has a package body 1212 and 14 pins or terminals 1214 numbered 1 through 14. Pin 1 is identified as input 1A, pin 2 is identified as input 1B, pin 13 is identified as input 1C, and pin 12 is identified as output 1Y. Pins 1, 2, 13, and 14 provide the inputs and output of a first NAND gate. Pin 3 is identified as input 2A, pin 4 is identified as input 2B, pin 5 is identified as input 2C, and pin 6 is identified as output 2Y. Pins 3, 4, 5, and 6 provide the inputs and output of a second NAND gate. Pin 7 provides a connection to circuit ground GND. Pin 8 is identified as output 3Y, pin 9 is identified as input 3A, pin 10 is identified as input 3B, and pin 11 is identified as input 3C. Pins 8, 9, 10, and 11 provide the output and inputs of a third NAND gate. Pin 14 provides a connection to Vcc or circuit power.

An example of IC 1210 is part number SN54HC10, SN74HC10, Triple 3-Input Positive-NAND Gates from Texas Instruments Incorporated.

FIGS. 13A and 13B, respectively, depict symbols for three, three input AND gates 1302, 1304, and 1306, and a plan view representation of an encapsulated, triple 3-input AND gates integrated circuit 1310. Each of AND gates 1302, 1304, and 1306 has an A input, a B input, a C input, and a Y output.

IC 1310 has a package body 1312 and 14 pins or terminals 1314 numbered 1 through 14. Pin 1 is identified as input 1A, pin 2 is identified as input 1B, pin 13 is identified as input 1C, and pin 12 is identified as output 1Y. Pins 1, 2, 13, and 14 provide the inputs and output of a first AND gate. Pin 3 is identified as input 2A, pin 4 is identified as input 2B, pin 5 is identified as input 2C, and pin 6 is identified as output 2Y. Pins 3, 4, 5, and 6 provide the inputs and output of a second AND gate. Pin 7 provides a connection to circuit ground GND. Pin 8 is identified as output 3Y, pin 9 is identified as input 3A, pin 10 is identified as input 3B, and pin 11 is identified as input 3C. Pins 8, 9, 10, and 11 provide the output and inputs of a third AND gate. Pin 14 provides a connection to Vcc or circuit power.

An example of IC 1310 is part number SN54HC11, SN74HC11, Triple 3-Input AND Gates from Texas Instruments Incorporated.

FIGS. 14A and 14B, respectively, depict symbols for three, three input NOR gates 1402, 1404, and 1406, and a plan view representation of an encapsulated, triple 3-input NOR gates integrated circuit 1410. Each of NOR gates 1402, 1404, and 1406 has an A input, a B input, a C input, and a Y output.

IC 1410 has a package body 1412 and 14 pins or terminals 1414 numbered 1 through 14. Pin 1 is identified as input 1A, pin 2 is identified as input 1B, pin 13 is identified as input 1C, and pin 12 is identified as output 1Y. Pins 1, 2, 13, and 14 provide the inputs and output of a first NOR gate. Pin 3 is identified as input 2A, pin 4 is identified as input 2B, pin 5 is identified as input 2C, and pin 6 is identified as output 2Y. Pins 3, 4, 5, and 6 provide the inputs and output of a second NOR gate. Pin 7 provides a connection to circuit ground GND. Pin 8 is identified as output 3Y, pin 9 is identified as input 3A, pin 10 is identified as input 3B, and pin 11 is identified as input 3C. Pins 8, 9, 10, and 11 provide the output and inputs of a third NOR gate. Pin 14 provides a connection to Vcc or circuit power.

An example of IC 1410 is part number CD54HC27, CD74HC27, Triple 3-Input NOR Gates from Texas Instruments Incorporated.

Figure 15A:
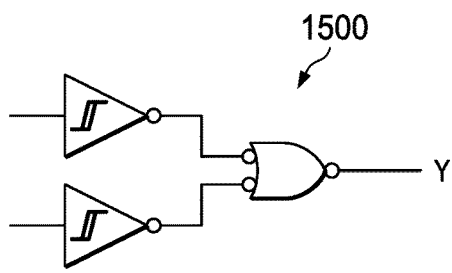
FIGS. 15A and 15B respectively are a symbol for a two input NOR gate with Schmitt-trigger inputs and a plan view representation of an encapsulated integrated circuit providing a set of four, two input NOR gates with Schmitt-trigger inputs.
Figure 15B:
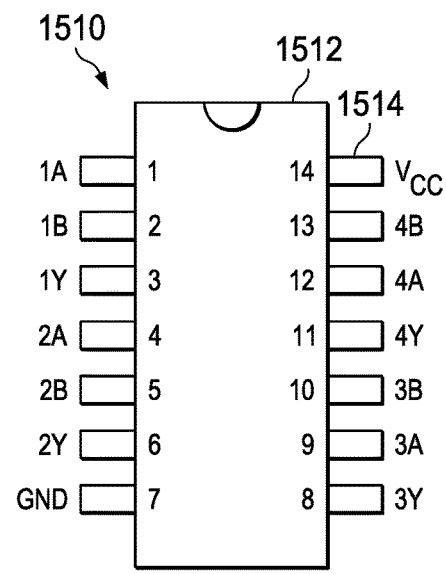

FIGS. 15A and 15B, respectively, depict symbols for a NOR gate 1500 with Schmitt-trigger inputs and a plan view representation of an encapsulated, quad NOR gates with Schmitt-trigger inputs integrated circuit 1510. NOR gate 1500 has an A input, a B input and a Y output.

IC 1510 has a package body 1512 and 14 pins or terminals 1514 numbered 1 through 14. Pin 1 is identified as input 1A, pin 2 is identified as input 1B, and pin 3 is identified as output 1Y. Pins 1, 2, and 3 provide the inputs and output of a first NOR gate. Pin 4 is identified as input 2A, pin 5 is identified as input 2B, and pin 6 is identified as output 2Y. Pins 4, 5, and 6 provide the inputs and output of a second NOR gate. Pin 7 provides a connection to circuit ground GND. Pin 8 is identified as output 3Y, pin 9 is identified as input 3A, and pin 10 is identified as input 3B. Pins 8, 9, and 10 provide the output and inputs of a third NOR gate. Pin 11 is identified as output 4Y, pin 12 is identified as input 4A, and pin 13 is identified as input 4B. Pins 11, 12, and 13 provide the output and inputs of a fourth NOR gate. Pin 14 provides a connection to Vcc or circuit power.

An example of IC 1510 is part number SN54HC7002, SN74HC7002, Quadruple Positive-NOR Gates With Schmitt-Trigger Inputs from Texas Instruments Incorporated.

Figure 16A:
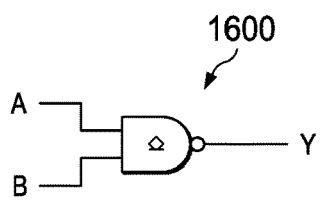
FIGS. 16A and 16B respectively are a symbol for a two input NAND gate with open drain outputs and a plan view representation of an encapsulated integrated circuit providing a set of four, two input NAND gates with open drain outputs.
Figure 16B:
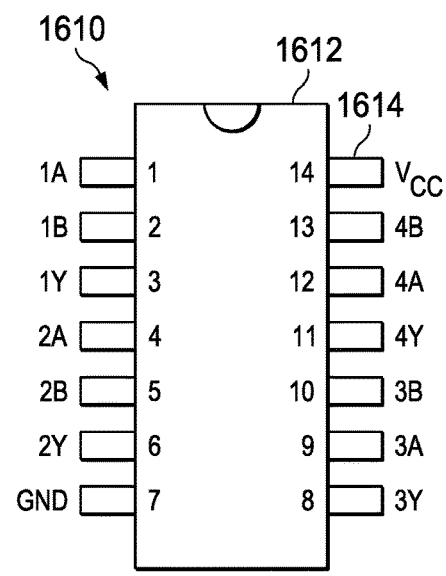

FIGS. 16A and 16B, respectively, depict symbols for a NAND gate 1600 with open drain outputs and a plan view representation of an encapsulated, quad NAND gates with open drain outputs integrated circuit 1610. NAND gate 1600 has an A input, a B input and a Y output.

IC 1610 has a package body 1612 and 14 pins or terminals 1614 numbered 1 through 14. Pin 1 is identified as input 1A, pin 2 is identified as input 1B, and pin 3 is identified as output 1Y. Pins 1, 2, and 3 provide the inputs and output of a first NAND gate. Pin 4 is identified as input 2A, pin 5 is identified as input 2B, and pin 6 is identified as output 2Y. Pins 4, 5, and 6 provide the inputs and output of a second NAND gate. Pin 7 provides a connection to circuit ground GND. Pin 8 is identified as output 3Y, pin 9 is identified as input 3A, and pin 10 is identified as input 3B. Pins 8, 9, and 10 provide the output and inputs of a third NAND gate. Pin 11 is identified as output 4Y, pin 12 is identified as input 4A, and pin 13 is identified as input 4B. Pins 11, 12, and 13 provide the output and inputs of a fourth NOR gate. Pin 14 provides a connection to Vcc or circuit power.

An example of IC 1610 is part number SN54HC03, SN74HC03, Quadruple 2-Input Positive-NAND Gates With Open-Drain Outputs from Texas Instruments Incorporated.

Figure 17B:
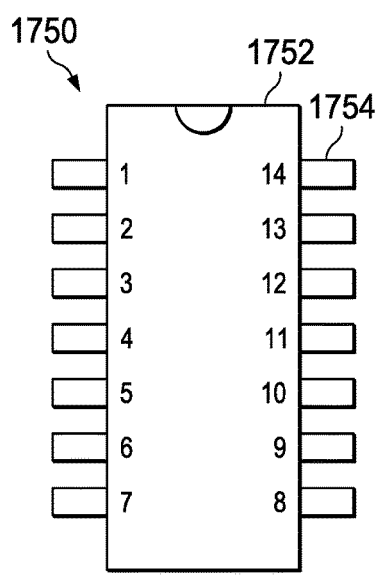
FIGS. 17A and 17B respectively are a plan view of an integrated circuit die according to the disclosure and a plan view representation of an encapsulated integrated circuit providing the die according to the disclosure.
Figure 17A:
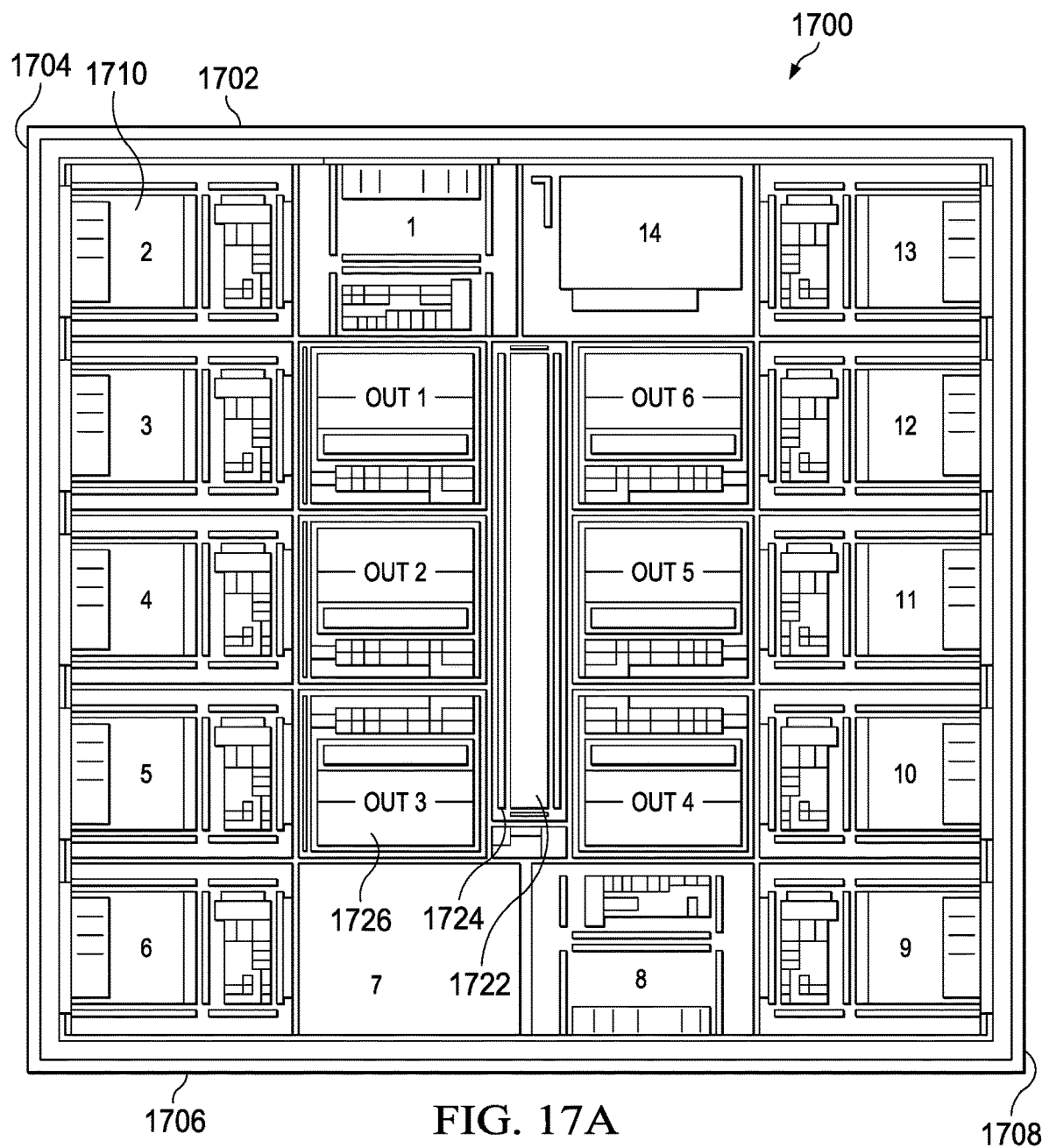

FIG. 17A depicts a representation of a master die 1700 having a first side 1702, a second side 1704, a third side 1706 opposite first side 1702, and a fourth side 1708 opposite second side 1704. This representation of master die 1700 generally illustrates the relative positions of circuit elements and is not intended to depict specific circuit elements. Die 1700 provides a total of fourteen bond pads areas 1710 numbered 1 through 14 around the periphery of the die. In a finished die, each bond pad area will carry an actual bond pad; hereinafter, descriptions will be to bond pads and not bond pad areas. Bond pad number 14 is for providing circuit power and bond pad 7 is for providing circuit ground for all configurations. All of bond pads 1-6 and 8-13 are configured for use as a digital logic function input and any one of bond pads 1-6 and 8-13 can be configured for use as a digital logic function output. Each of bond pads 1-6 and 8-13 can be described as an I/O bond pad or functional bond pad.

Bond pads 1-6 and bond pads 8-14 overlie protective electrostatic discharge circuits that are not separately depicted.

Each of bond pads 1-6 and 8-13 also has an input circuit or input buffer coupled to the bond pad and arranged adjacent the bond pad. The ESD circuits and input circuits are not separately identified with reference numbers in this figure.

Die 1700 includes sets of digital function logic circuits 1722 in a central portion. Digital function logic circuits 1722 are surrounded by a ring 1724 of two metal level layers. The metal level layers of ring 1724 will provide interconnects between the circuits of the die.

Die 1700 includes six output circuits 1726 numbered OUT1 through OUT6 arranged between the bond pad areas 1710 and the ring 1724 of metal level layers 1724.

FIG. 17B depicts an encapsulated, packaged integrated circuit or IC 1750 having a package body 1752 and 14 pins or terminals 1754 numbered 1 through 14. IC 1750 represents a finished digital logic IC containing die 1700 that has been configured to provide a set of desired digital logic functions from one of the sets of digital logic functions provided in digital function logic 1722.

Figure 18:
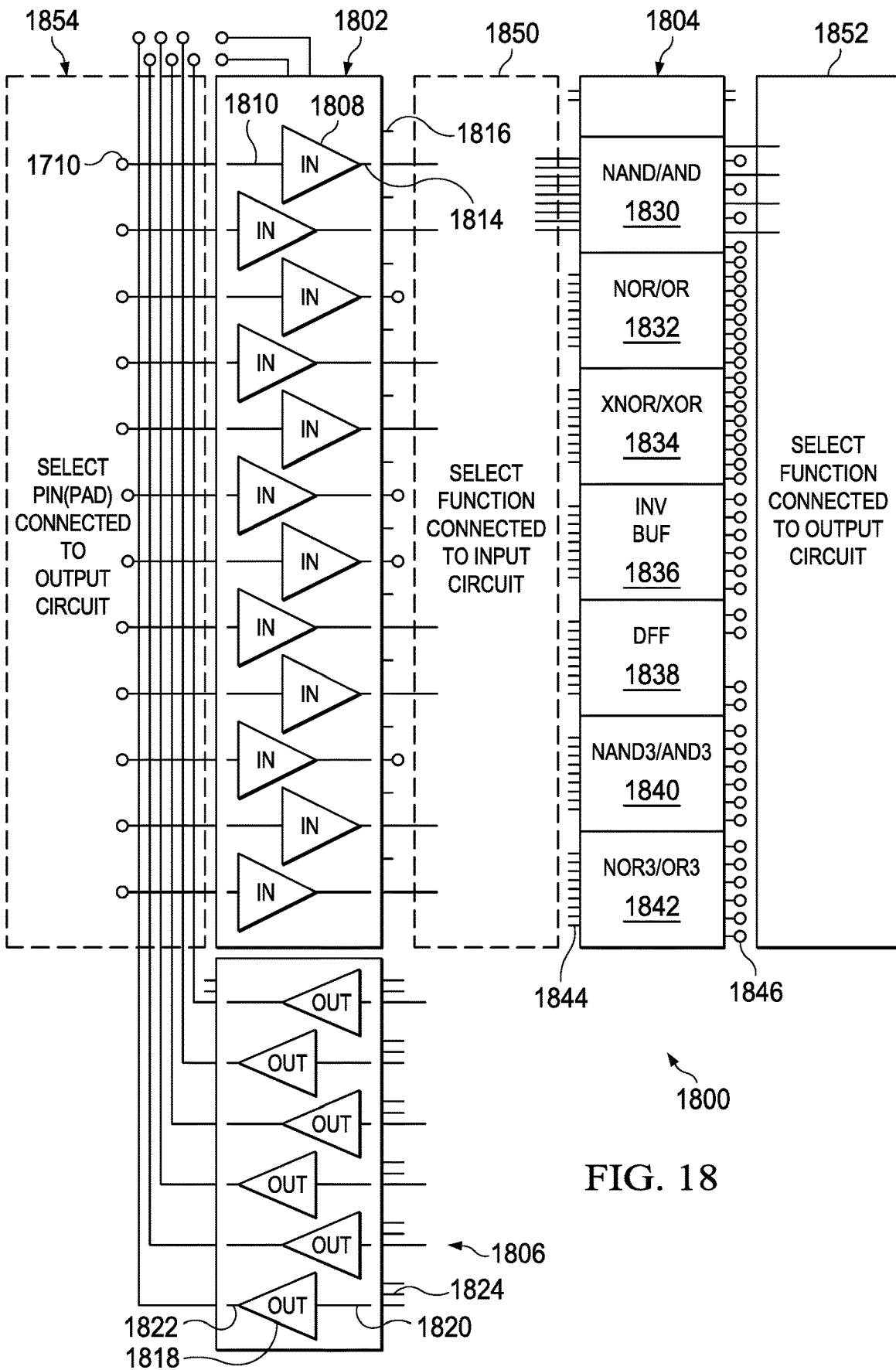
FIG. 18 is a schematic diagram of the circuits in the die of FIG. 17A.

FIG. 18 depicts a schematic diagram 1800 of the circuits of master die 1700 having twelve input circuits 1802, digital logic function circuitry 1804, and six output circuits 1806. Each input circuit has an input lead 1810 coupled to an input bond pad 1710, an output lead 1814, and an output enable input 1816. Each output circuit 1818 has an input lead 1820, an output lead 1822, and an output enable input 1824.

The digital logic functions 1804 include sets of NAND/AND gate circuits 1830; sets of NOR/OR gate circuits 1832; sets of XNOR/XOR gate circuits 1834; sets of inverter and buffer circuits 1836; a set of D-type flip flop circuits, DFF, 1838; sets of NAND3/AND3 gate circuits 1840; and sets of NOR3/OR3 gate circuits 1842. The digital logic functions in each set have an input lead, such as input lead 1844, and have an output lead, such as output lead 1846.

The sets of NAND/AND gate circuits 1830 provide four two input NAND gates as depicted in FIGS. 1A and 1B, and 16A and 16B, and four two input AND gates as depicted in FIGS. 3A and 3B.

The sets of NOR/OR gate circuits 1832 provide four two input NOR gates as depicted in FIGS. 2A and 2B, and 15A and 15B, and four two input OR gates as depicted in FIGS. 6A and 6B.

The sets of XNOR/XOR gate circuits 1834 provide four two input XNOR gates as depicted in FIGS. 8A and 8B, and four two input XOR gates as depicted in FIGS. 7A and 7B.

The sets of inverter and buffer circuits 1836 provide four inverter circuits as depicted in FIGS. 10A and 10B, and 11A and 11B, and four buffer circuits as depicted in FIGS. 4A and 4B, 5A and 5B.

The set of D-type flip flop circuits DFF 1838 provide two D-type flip flops as depicted in FIGS. 9A and 9B.

The sets of NAND3/AND3 gate circuits 1840 provide three, three input NAND gates as depicted in FIGS. 12A and 12B, and three, three input AND gates as depicted in FIGS. 13A and 13B.

The sets of NOR3/OR3 gate circuits 1842 provide three, three input NOR gates as depicted in FIGS. 14A and 14B, and three, three input OR gates.

Schematic diagram 1800 also depicts a first select function structure 1850, a second select function structure 1852, and a third select function structure 1854. Select function structures 1850 and 1852 are formed by the ring 1724 of upper lever metal layers used to configure the die 1700 into a desired digital logic function. First select structure 1850 is used to electrically connect the outputs 1814 of the input circuits 1818 to selected inputs 1844 of the digital logic function circuits 1804. Second select structure 1852 is used to electrically connect the outputs 1846 of the digital logic functions 1804 to selected inputs 1820 of the output circuits 1806. Third select structure 1854 is used to electrically connect the outputs 1822 of the output circuits 1818 to selected bond pads 1710.

The schematic diagram 1800 represents the circuitry of master die processed to a intermediate stage before configuration of the master die into one of the configurable digital logic functions. The inputs 1844 of the digital logic function circuits 1804 remain un-connected to the outputs 1814 of the input circuits 1808, the outputs 1846 of the digital logic function circuits 1804 remain un-connected to the inputs 1820 of the output circuits 1818, and the outputs 1822 of the output circuits remain un-connected to the output bond pads 1710.

Figure 19A:
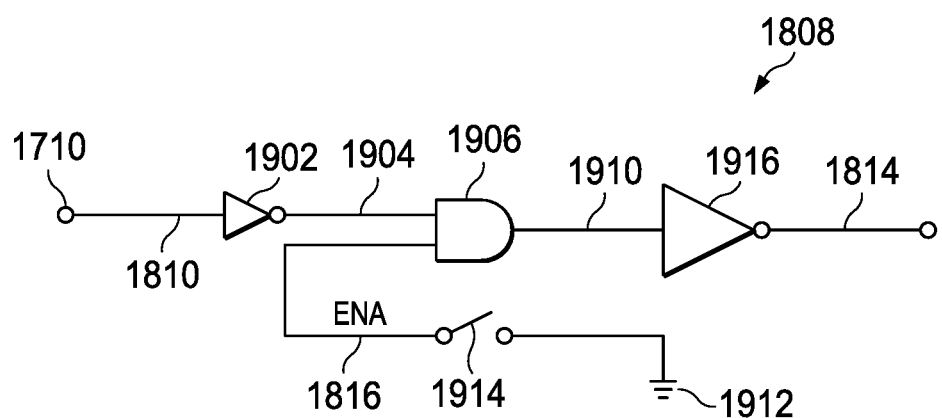
FIGS. 19A and 19B respectively are schematic diagrams of circuits with option straps.

FIG. 19A depicts a representative input circuit 1808 and includes an inverter 1902 having the input lead 1810 connected to one of the input bond pads 1710, and an output lead 1904 connected to an input of AND gate 1906. AND gate 1906 has another input connected to the output enable lead 1816 and has an output lead 1910 connected to an input of inverter 1916, which has the input circuit output lead 1814. Output enable lead 1816 can be selectively connected to circuit ground 1912 through strapping structure 1914, which can be implemented in such as a via between levels of metal layers in the ring 1724.

The effect of strapping the output enable lead 1816 to circuit ground 1912 is to disable the input circuit 1808 from operation when it is not being used in the selected, configured digital logic function. When the output enable lead 1816 is not strapped to ground, the input circuit is enabled. A disabled input circuit 1808 draws little current when the configured digital logic function operates.

FIG. 19A depicts the strapping structure 1914 as an open switch. In actual implementation in the master die, the open switch may be implemented as desired, such as by not forming an electrical connection between conductive leads. In this example an open strapping structure can be implemented as no via between upper level metal layers. In actual implementation in the master die, a closed switch may be implemented as desired, such as by forming a connection between conductive leads. In this example a closed strapping structure can be implemented as a via between upper level metal layers. The form of this switch or electrical connection can occur as desired. This description of strapping structure 1914 applies to all of the descriptions of strapping structures in this specification, including output circuits.

Figure 19B:
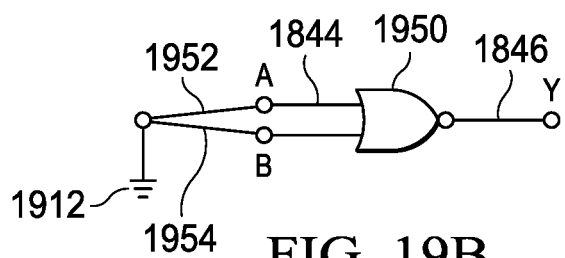

FIG. 19B depicts a representative NOR gate 1950 having an A input, a B input, and a Y output. The A and B inputs correspond to two of the digital logic function inputs 1844 and the Y output corresponds to one of the digital logic function outputs 1846. The A and B inputs are selectively connected to circuit ground through strap structures 1952 and 1954, which can be implemented in such as vias between levels of metal layers in the ring 1724. A digital logic function gate that has its inputs tied to circuit ground draws little current when the configured digital logic function operates.

The strapping structures depicted in FIGS. 19A and 19B can also be used to electrically connect output circuit 1806 enable input leads, such as enable input lead 1824 to circuit ground 1912.

Figure 20:
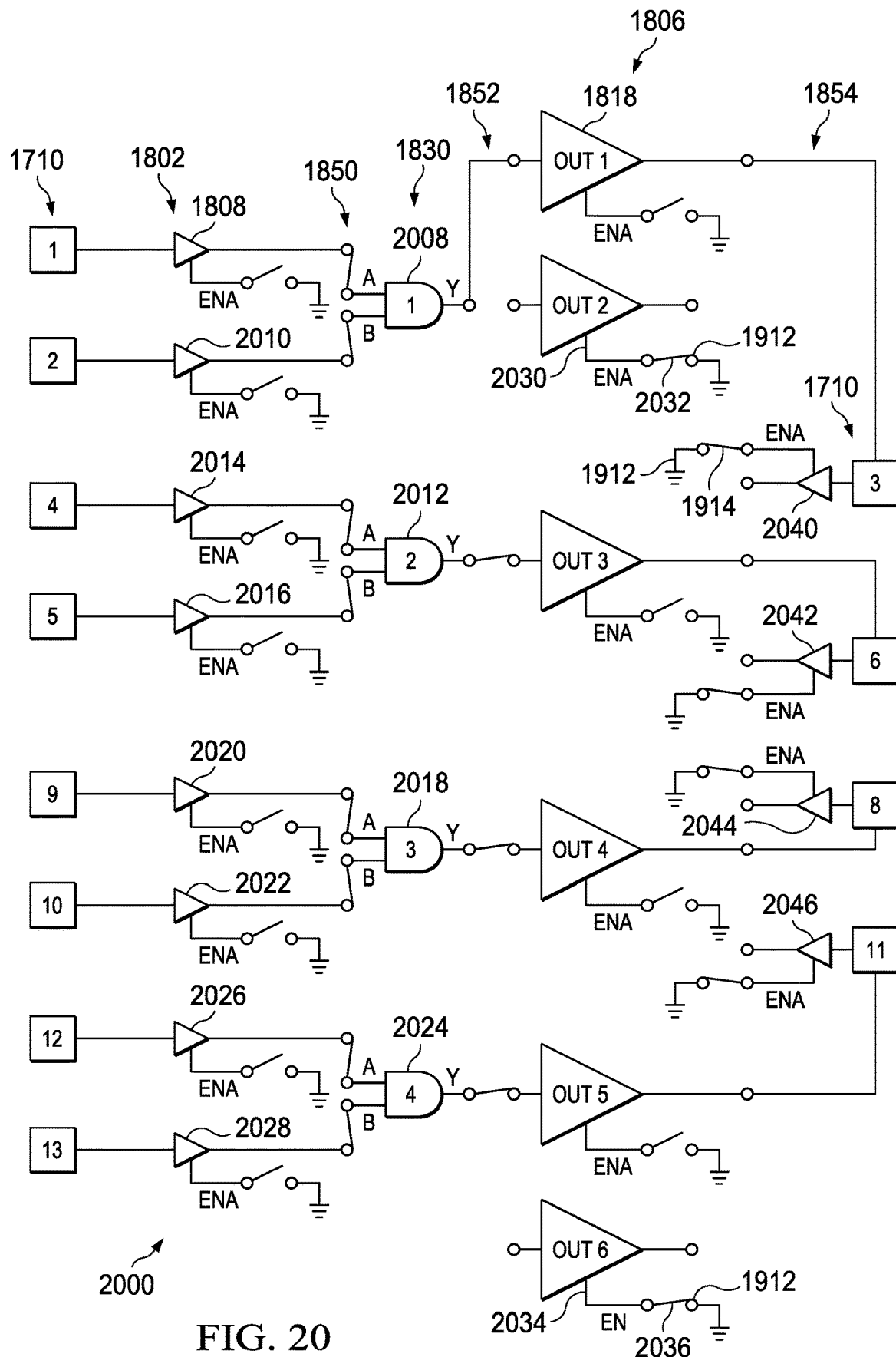
FIG. 20 is a schematic diagram of logic circuits providing a set of four, two input NAND gates.

FIG. 20 depicts part 2000 of a master die 1700 configured to implement a set of quad, 2-input AND gate digital logic functions, which digital logic functions are as depicted in FIGS. 3A and 3B. Using corresponding reference numbers from earlier figures, part 2000 has bond pads 1710 numbered 1-6 and 8-13, input circuits 1802, first select function structure 1850, digital logic functional AND gate circuits 1830 numbered 1-4, second select function structure 1852, output circuits 1806 numbered 1-6, and third select function structure 1854. Input circuit 1808 and output circuit 1818 use reference numbers from FIG. 18.

FIG. 20 depicts, as an example, the configuration of one AND gate 2008 having an A input coupled to bond pad number 1 through input circuit 1808, a B input coupled to bond pad number 2 through input circuit 2010, and a Y output coupled to bond pad 3 through output circuit OUT1 1818.

AND gate 2012 has an A input coupled to bond pad number 4 through input circuit 2014, a B input coupled to bond pad number 2 through input circuit 2016, and a Y output coupled to bond pad 6 through output circuit OUT3.

AND gate 2018 has an A input coupled to bond pad number 9 through input circuit 2020, a B input coupled to bond pad number 10 through input circuit 2022, and a Y output coupled to bond pad 8 through output circuit OUT4.

AND gate 2024 has an A input coupled to bond pad number 12 through input circuit 2026, a B input coupled to bond pad number 13 through input circuit 2028, and a Y output coupled to bond pad 11 through output circuit OUT5.

Output circuits OUT1 and OUT 6 remain un-connected to a digital logic circuit and a bond pad as they are not needed in this configuration. The enable lead 2030 of output circuit OUT2 is connected to circuit ground 1912 through strap 2032 to disable the operation of output circuit OUT 2. The enable lead 2034 of output circuit OUT6 is also connected to circuit ground 1912 through strap 2036 to disable the operation of output circuit OUT6.

Input circuits 2040, 2042, 2044, and 2046 have their inputs, respectively, connected to bond pads 3, 4, 8, and 11 and have their enable leads ENA connected to circuit ground 1912 through straps or vias 1914. This disables operation of these input circuits because bond pads 3, 4, 8, and 11 are being used as output bond pads.

The enable leads of the input circuits 1802, 201, 2014, 2016, 2020, 2022, 2026, and 2028 and the output circuits OUT1 and OUT3-OUT5 are un-connected to circuit ground to enable their operation.

This configuration providing a set of four, two input AND gate circuits leaves other sets of digital logic function circuits 1804 un-connected to the input circuits and the output circuits.

Figure 21:
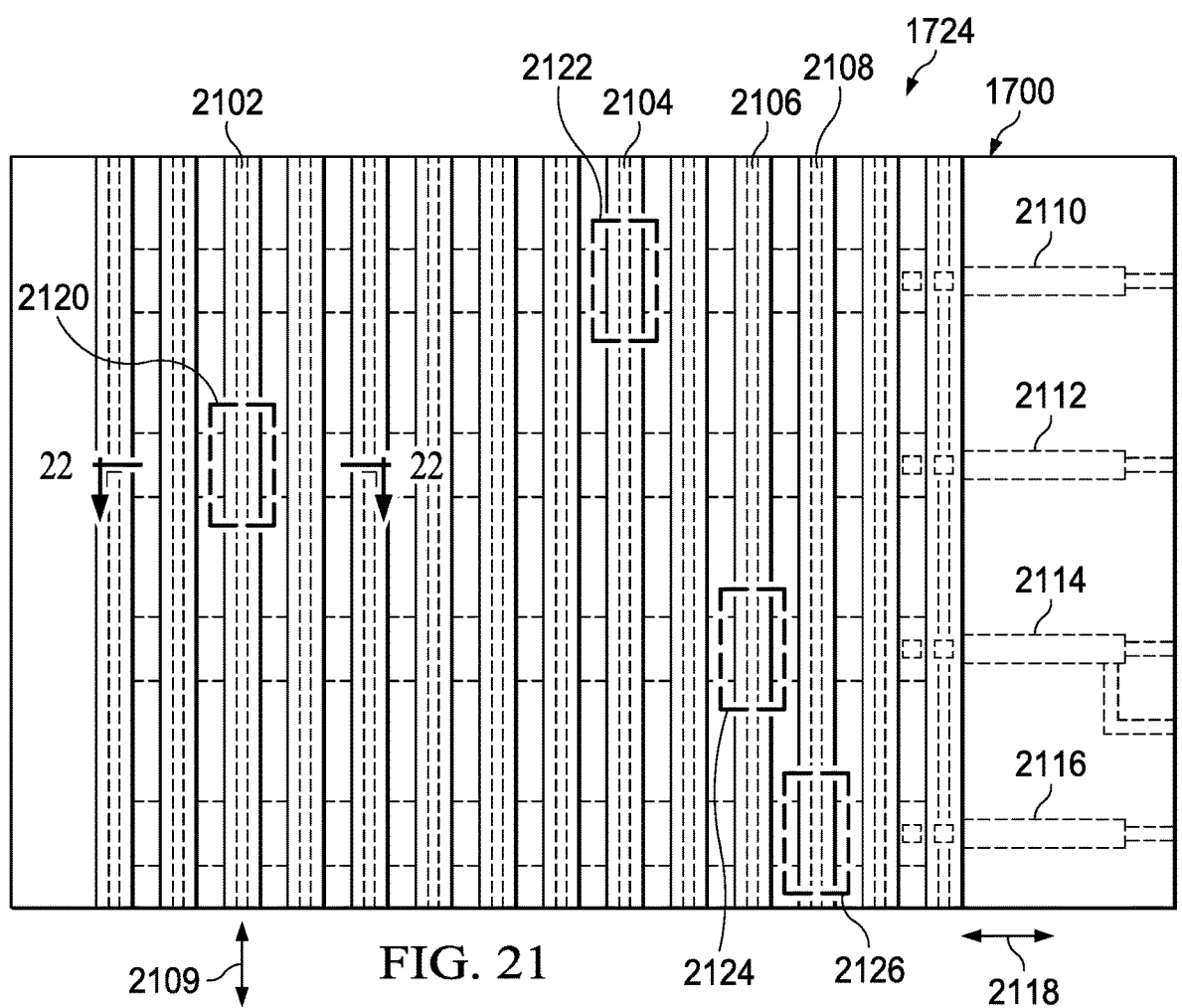
FIG. 21 is a partial, exploded plan view diagram of the die of FIG. 17 depicting conductive leads, indicating strapping vias with broken lines, and indicating cross-section line 22-22.

FIG. 21 depicts a portion of master die 1700, a part of ring 1724, a first level metal layer has 14 conductive leads, such as conductive leads 2102, 2104, 2106, and 2108, lying in one direction indicated by arrow 2109. A second level metal layer with four leads, such as conductive lead 2110, 2112, 2114, and 2116, drawn in dashed line output line, underlie the first level metal layer conductors 2102, 2104, 2106 and 2108 and lie in a second direction indicated by arrow 2118.

A via electrically connects conductive lead 2102 to conductive lead 2112 at area 2120 indicated in dashed line outline. A via electrically connects conductive lead 2104 to conductive lead 2110 at area 2122 indicated in dashed line outline. A via electrically connects conductive lead 2106 to conductive lead 2114 at area 2124 indicated in dashed line outline. A via electrically connects conductive lead 2108 to conductive lead 2116 at area 2126 indicated in dashed line outline.

Figure 22:
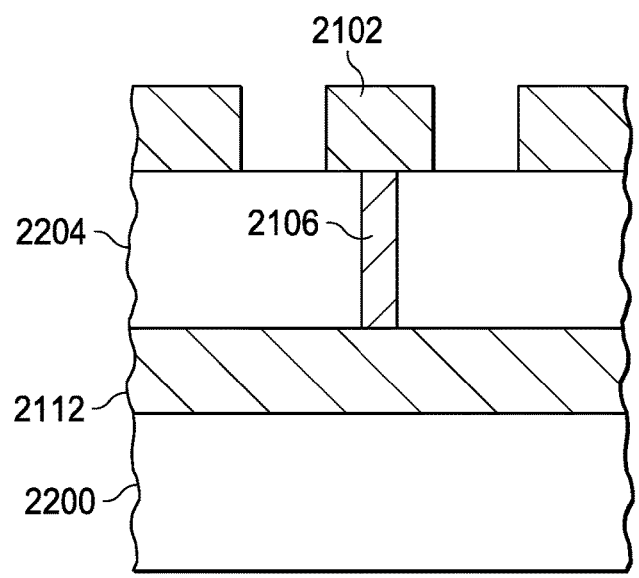
FIG. 22 is a cross-sectional view taken along the line 22-22 of FIG. 21 in the direction of the arrows and depicting a strapping structure via.

FIG. 22 depicts a substrate of semiconductor material 2200 with which master die 1700 is formed, carries the second level metal layer conductive leads, such as conductive lead 2112, an insulating layer 2202, and the first level metal layer conductive leads, such as conductive lead 2102. A via 2106 is formed through insulating layer 2204 and electrically connects conductive lead 2102 to conductive lead 2112.

In a like manner, other vias can provide the electrical connections or couplings between conductive leads anywhere on the master die. These other vias can couple together selected leads in the select function structures 1850, 1852, and 1854 depicted in FIG. 18. In a like manner, other vias can provide the couplings to circuit ground identified by strapping structures 1914, 1954, and 1952 and 1954 of FIGS. 19A and 19B.

Figure 23:
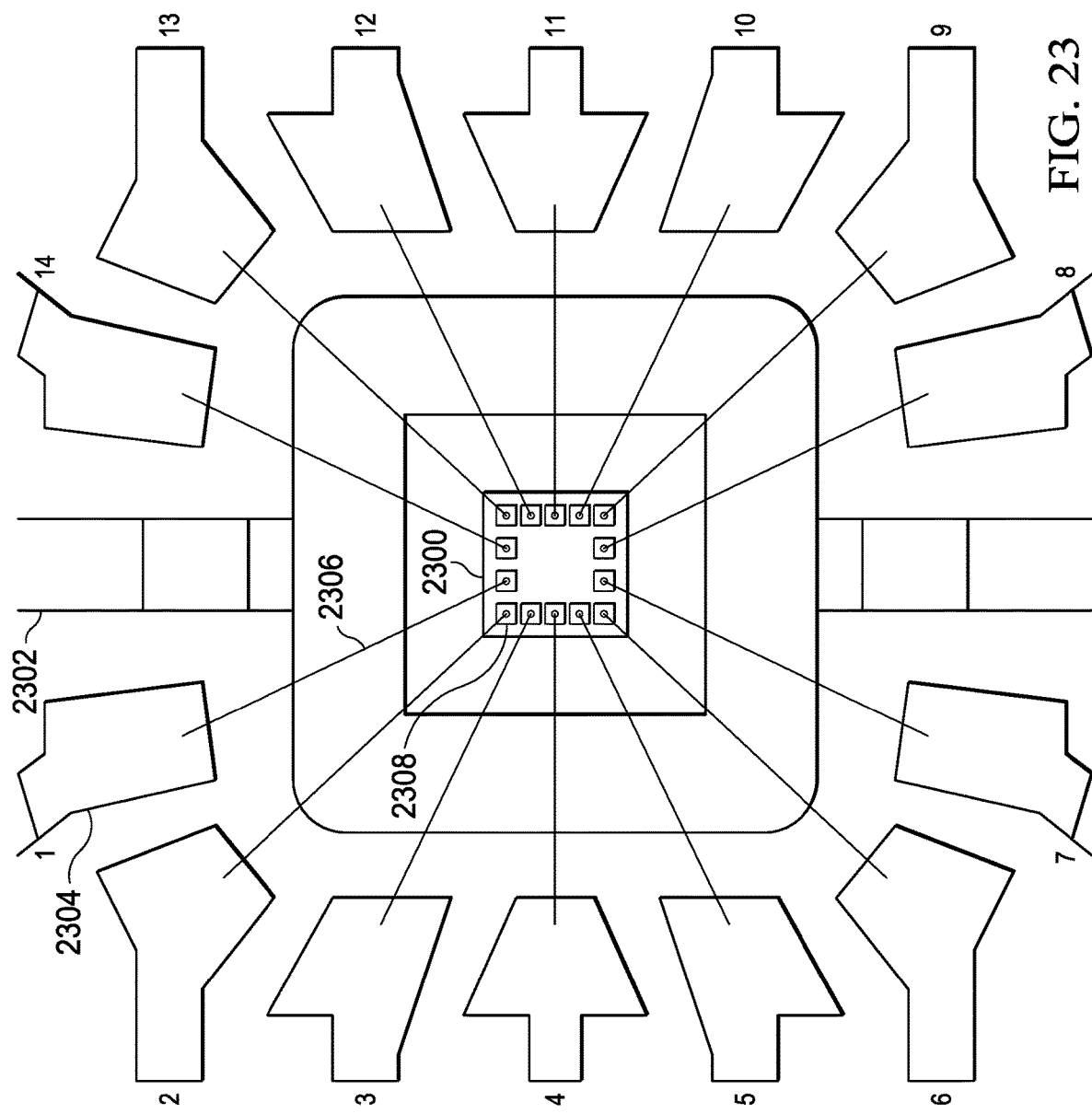
FIG. 23 is an idealized plan view of a semiconductor die, bond wires, and lead frame.

FIG. 23 depicts a completed and configured master die 2300 is attached to a land portion 2302 of a lead frame. The lead frame provides lead frame leads, such as lead frame lead 2304, numbered 1-14 in the same relation to each other as in the encapsulate, packaged integrated circuits depicted in previous figures. Bond wires, such as bond wire 2306, extend between bond pads, such as bond pad 2308, and the lead frame leads, such as lead frame lead 2304.

Figure 24:
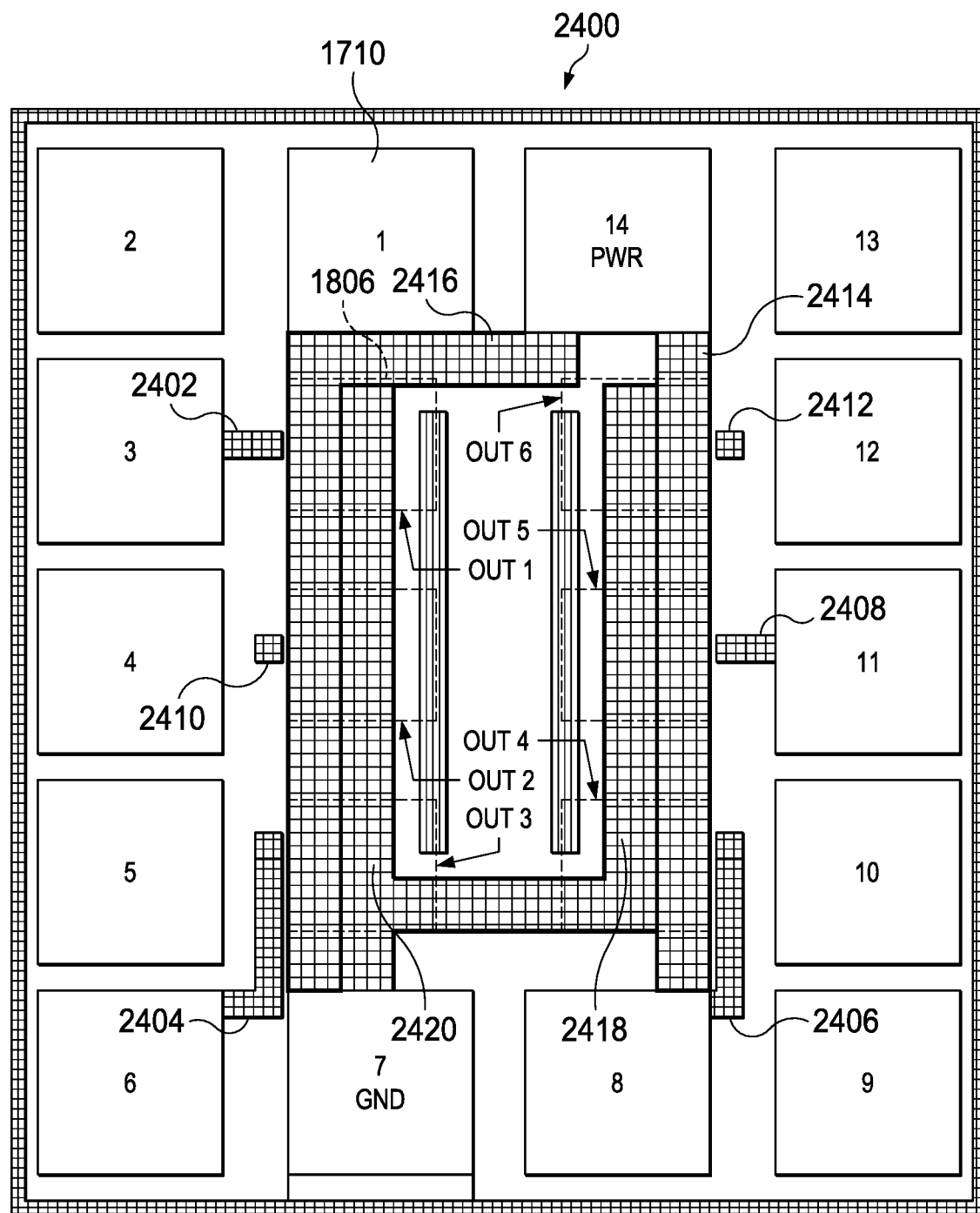
FIG. 24 is an idealized plan view of connections between the output circuits and bond pads as disclosed for FIGS. 1, 3, 4, 5, 6, 7, 15, and 16.

FIG. 24 depicts a die 2400 having bond pads 1710 numbered 1-14 and output circuits 1806 numbered OUT1-OUT6. Output circuits OUT1-OUT6 are depicted in dashed line outline because they are formed in the semiconductor die under the upper levels of metal depicted in this plan view. FIGS. 25 through 29 also depict the output circuits OUT1-OUT6 in dashed line outline for the same reason.

An upper level metal conductor 2402 couples output circuit OUT1 to bond pad 3. An upper level metal conductor 2404 couples output circuit OUT3 to bond pad 6. An upper level metal conductor 2406 couples output circuit OUT4 to bond pad 8. An upper level metal conductor 2408 couples output circuit OUT5 to bond pad 11. Output circuits OUT2 and OUT6 remain un-connected to bond pads. This is the configuration of coupling output circuits to bond pads for the sets of digital logic functions depicted in FIGS. 1, 3, 4, 5, 6, 7, 15, and 16.

Die 2400 also has stubs 2410 and 2412 that are connected, respectively to output circuit OUT2, and output circuit OUT6, but are not connected to any bond pad. These stubs 2410 and 24112 are formed in process steps preliminary to final process steps. Final process steps, among other things, form the upper level metal conductors to couple the stubs from the output circuits to bond pads and configure the die to a desired digital logic function. The dies in the following figures also depict these stubs, but without reference numerals.

Die 2400 also has two power leads formed of upper level metal conductors 2414 and 2416 extending from bond pad 14 across the die. Two circuit ground leads formed of upper level metal conductors 2418 and 2420 extend from bond pad 7 across the die alongside the power leads. The dies in the following figures also depict these power leads and circuit ground leads, but without reference numerals.

Figure 25:
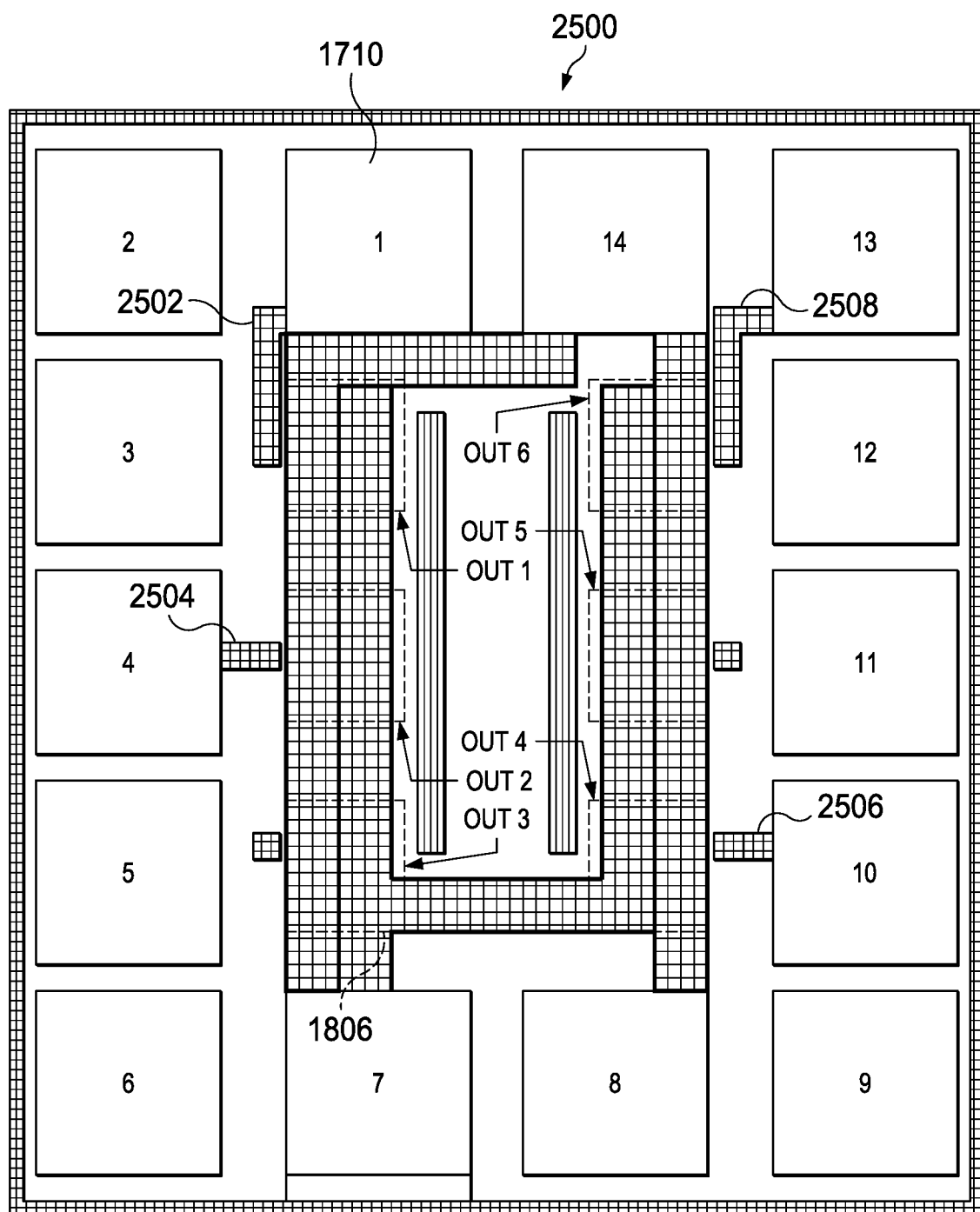
FIG. 25 is an idealized plan view of connections between the output circuits and bond pads as disclosed for FIG. 2.

FIG. 25 depicts a die 2500 having bond pads 1710 numbered 1-14 and output circuits 1806 numbered OUT1-OUT6. An upper level metal conductor 2502 couples output circuit OUT1 to bond pad 1. An upper level metal conductor 2504 couples output circuit OUT2 to bond pad 4. An upper level metal conductor 2506 couples output circuit OUT4 to bond pad 10. An upper level metal conductor 2508 couples output circuit OUT6 to bond pad 13. Output circuits OUT3 and OUT5 remain un-connected to bond pads. This is the configuration of coupling output circuits to bond pads for the set of digital logic functions depicted in FIG. 2.

Figure 26:
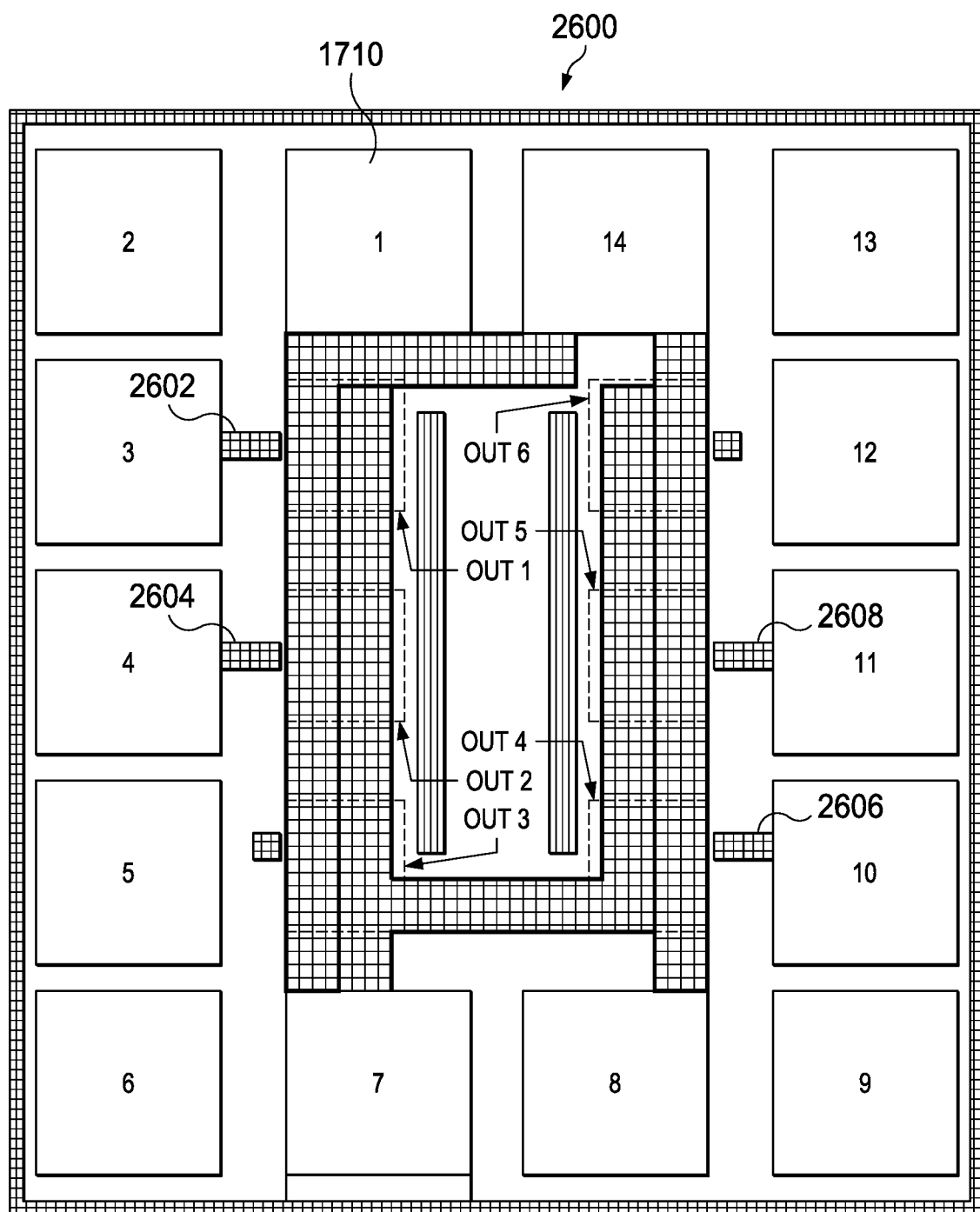
FIG. 26 is an idealized plan view of connections between the output circuits and bond pads as disclosed for FIG. 8.

FIG. 26 depicts a die 2600 having bond pads 1710 numbered 1-14 and output circuits 1806 numbered OUT1-OUT6. An upper level metal conductor 2602 couples output circuit OUT1 to bond pad 3. An upper level metal conductor 2604 couples output circuit OUT2 to bond pad 4. An upper level metal conductor 2606 couples output circuit OUT4 to bond pad 10. An upper level metal conductor 2608 couples output circuit OUT5 to bond pad 11. Output circuits OUT3 and OUT6 remain un-connected to bond pads. This is the configuration of coupling output circuits to bond pads for the set of digital logic functions depicted in FIG. 8.

Figure 27:
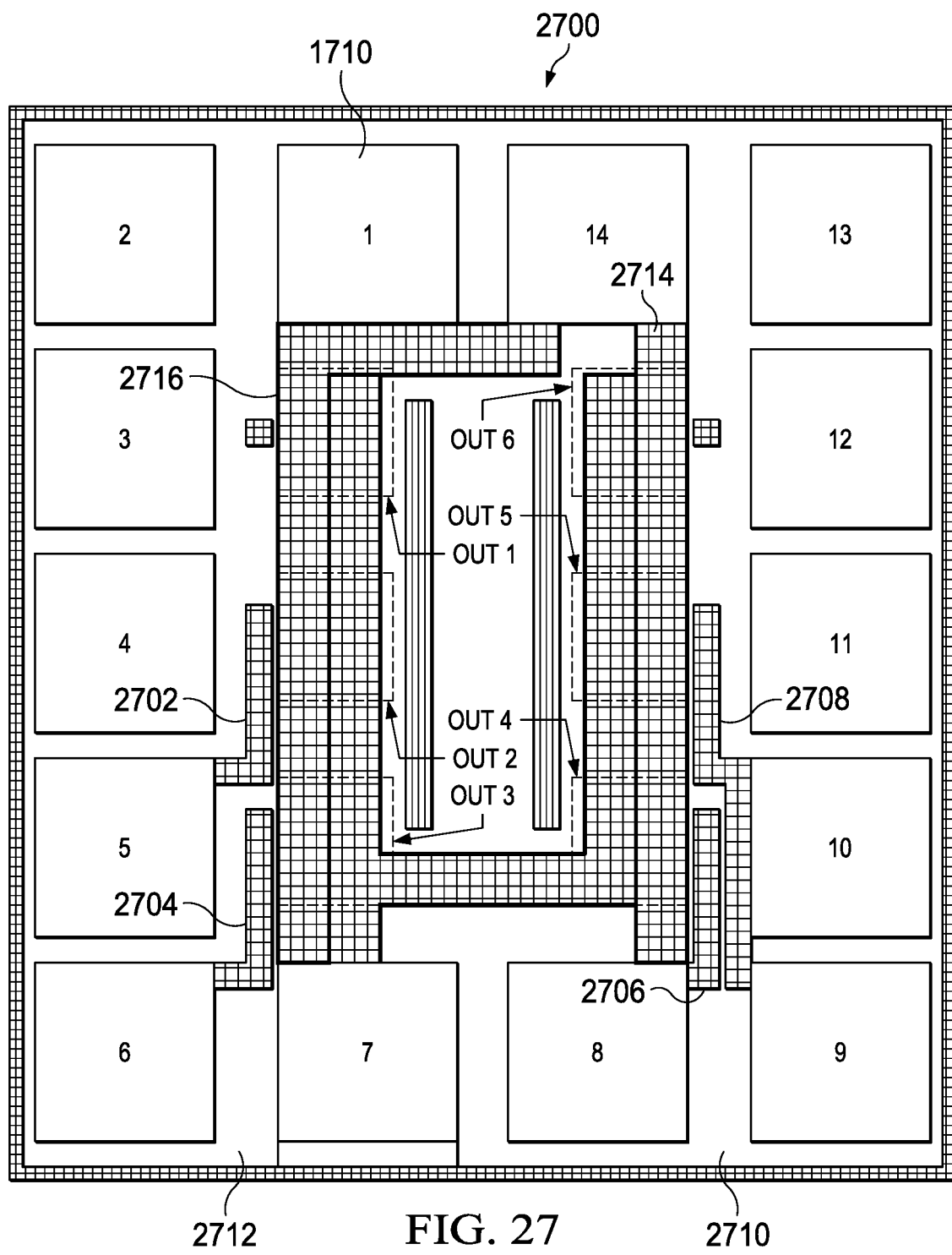
FIG. 27 is an idealized plan view of connections between the output circuits and bond pads as disclosed for FIG. 9.

FIG. 27 depicts a die 2700 having bond pads 1710 numbered 1-14 and output circuits 1806 numbered OUT1-OUT6. An upper level metal conductor 2702 couples output circuit OUT2 to bond pad 5. An upper level metal conductor 2704 couples output circuit OUT3 to bond pad 6. An upper level metal conductor 2706 couples output circuit OUT4 to bond pad 8. An upper level metal conductor 2708 couples output circuit OUT5 to bond pad 9. Output circuits OUT1 and OUT6 remain un-connected to bond pads. This is the configuration of coupling output circuits to bond pads for the set of digital logic functions depicted in FIG. 9.

Die 2700 provides a space 2710 between bond pads 9-13 and bond pads 8 and 14 and the power lead in upper level conductor 2714 that is wide enough to accommodate the two conductors 2706 and 2708 side by side without shorting to one another or to bond pad 10 or the power lead in upper level conductor 2714. Die 2700 provides a like space 2712 between bond pads 2-6 and bond pads 1 and 7 and the power lead in upper level conductor 2716. These spaces 2710 and 2712 are features of the layout of die 2700 and all of the other dies disclosed in this application and provide space or area for coupling the output circuits to the bond pads in different configurations in final processing steps.

Figure 28:
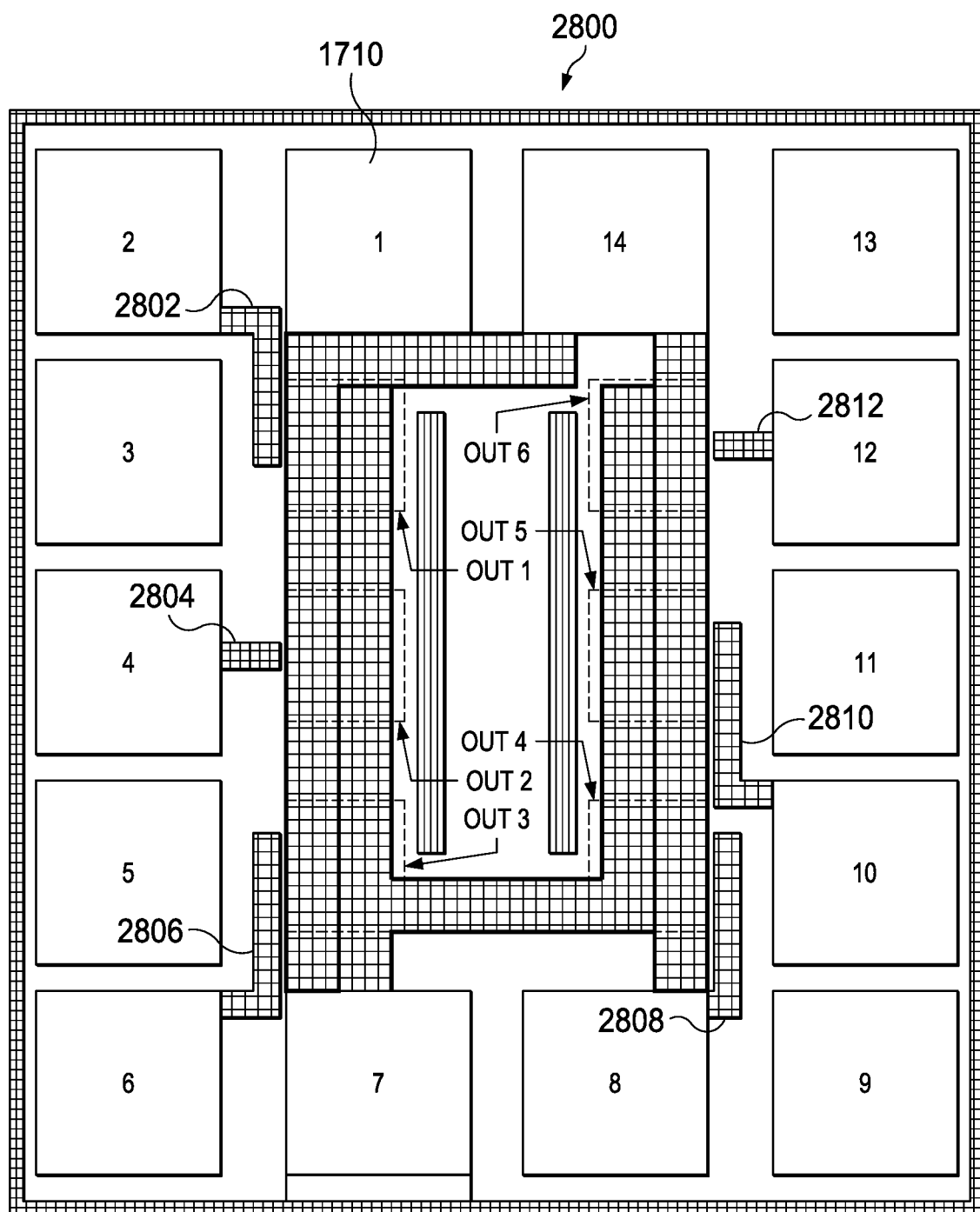
FIG. 28 is an idealized plan view of connections between the output circuits and bond pads as disclosed for FIGS. 10 and 11.

FIG. 28 depicts a die 2800 having bond pads 1710 numbered 1-14 and output circuits 1806 numbered OUT1-OUT6. An upper level metal conductor 2802 couples output circuit OUT1 to bond pad 2. An upper level metal conductor 2804 couples output circuit OUT2 to bond pad 4. An upper level metal conductor 2806 couples output circuit OUT3 to bond pad 6. An upper level metal conductor 2808 couples output circuit OUT4 to bond pad 8. An upper level metal conductor 2810 couples output circuit OUT5 to bond pad 10. An upper level metal conductor 2812 couples output circuit OUT6 to bond pad 12. All of the output circuits OUT1-OUT6 are connected to bond pads. This is the configuration of coupling output circuits to bond pads for the sets of digital logic functions depicted in FIGS. 10 and 11.

Figure 29:
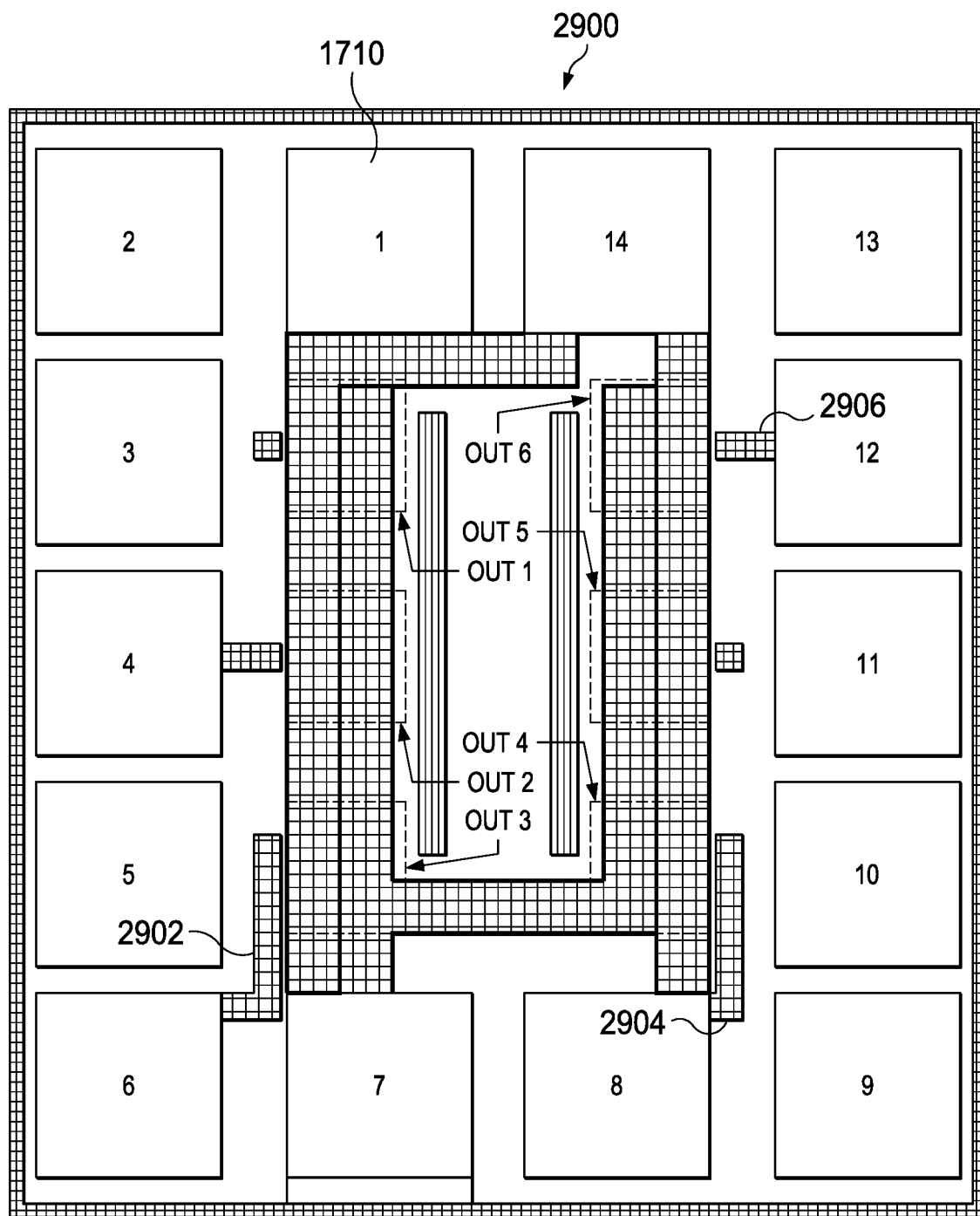
FIG. 29 is an idealized plan view of connections between the output circuits and bond pads as disclosed for FIGS. 12, 13, and 14.

FIG. 29 depicts a die 2900 having bond pads 1710 numbered 1-14 and output circuits 1806 numbered OUT1-OUT6. An upper level metal conductor 2902 couples output circuit OUT3 to bond pad 6. An upper level metal conductor 2904 couples output circuit OUT4 to bond pad 8. An upper level metal conductor 2906 couples output circuit OUT6 to bond pad 12. Output circuits OUT1, OUT2, and OUT5 remain un-connected to bond pads. This is the configuration of coupling output circuits to bond pads for the set of digital logic functions depicted in FIGS. 12, 13, and 14.

In FIGS. 24-29, the upper level metal conductors that couple the output circuits to the bond pads are wider than the conductors used to couple the input circuits to the digital logic circuits and are wider than the conductors used to couple the digital logic circuits to the output circuits. The reason for these wider conductors is that the output circuits must source much more drive current to the outputs than the other conductors need to carry. To accommodate these wider conductors from the output circuits to the bond pads, the dies must have the wide spaces, such as spaces 2710 and 2712 between the output circuits and bond pads.

Figure 30:
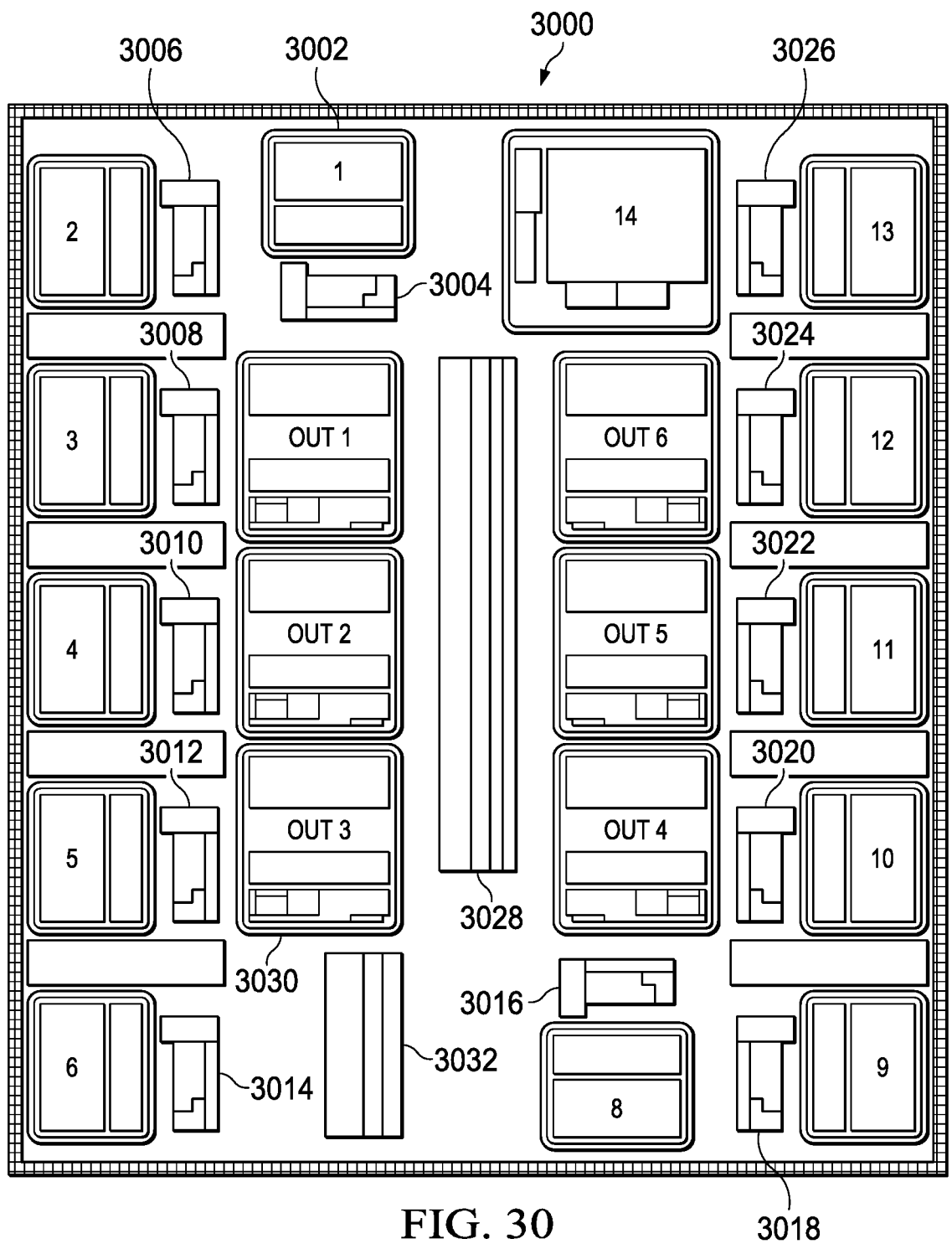
FIG. 30 is a plan view of an intermediate stage of processing a die before adding upper level metal interconnections.

FIG. 30 depicts a die 3000 processed to an intermediate step implementing circuitry before any overlying metal level interconnects are formed. Die 3000 includes thirteen electrostatic discharge (ESD) circuits 3002 numbered 1-6 and 8-14; ESD circuit number 14 will be under the circuit power bond pad and is larger than the other electrostatic discharge circuits. There is no ESD circuit between ESD circuits 6 and 8 because this area will be under the circuit ground bond pad.

Die 3000 includes twelve input circuits 3004-3026 arranged adjacent the ESD circuits 1-6 and 8-13, centrally located digital logic circuits 3028 providing the desired digital logic functions, and six output circuits 3030 numbered OUT1-OUT6, located between the digital logic circuits and the input circuits. Additional digital logic circuits 3032 are formed in the area between ESD circuits 6 and 8, under where the circuit ground bond pad will be formed.

This arrangement of logical functions in one design reduces engineering design time by designing multiple configurable parts at one time, instead of designing eight separate parts. This arrangement of logical functions in one design also reduces inventory and time to deliver a customer order. By making IC 1700 only to an intermediate manufacturing step, keeping only that intermediate product in inventory, and later finishing manufacturing by configuring the desired logical function according to a customer order, this design can reduce inventory requirements and time to delivery after the customer order.

This specification and accompanying drawing figures disclose and depict a limited number of digital logic functions implemented and configured on one semiconductor die as an example of possible digital logic functions that can be so implemented and configured. Other digital logic functions are envisioned and can be implemented and configured on like semiconductor dies within the scope of this disclosure.

We claim:

1. An integrated circuit semiconductor die comprising:
   (a) bond pads;
   (b) a first set of functional circuitry and a second set of functional circuitry, the sets of functional circuitry having functional inputs and functional outputs;
   (c) input circuits, the input circuits having inputs coupled to the bond pads and having outputs;
   (d) output circuits, the output circuits having inputs and having outputs coupled to the bond pads; and
   (e) strapping structures coupling the outputs of the input circuits to the inputs of only the first set of functional circuitry and coupling the outputs of only the first set of functional circuitry to the inputs of the output circuits.

2. The integrated circuit semiconductor die of claim 1 in which the strapping structures include vias.

3. The integrated circuit semiconductor die of claim 1 in which the strapping structures include upper metal level layer leads interconnected with vias.

4. The integrated circuit semiconductor die of claim 1 in which the inputs of the second set of functional circuitry remain uncoupled to the outputs of the input circuits and the outputs of the second set of functional circuitry remain uncoupled to the inputs of the output circuits.

5. The integrated circuit semiconductor die of claim 1 in which the sets of functional circuitry are digital logic.

6. An integrated circuit semiconductor die comprising:
   (a) bond pads;
   (b) a first set of circuitry including a first circuit having an input and an output;
   (c) a second set of circuitry including a second circuit having an input and an output;
   (d) input circuitry having an input coupled to a bond pad and having an output;
   (e) output circuitry having an input and having an output;
   (f) first strapping structures coupling the output of the input circuitry to the input of the first circuit; and
   (g) second strapping structures coupling the output of the first circuit to the input of the output circuitry.

7. The integrated circuit semiconductor die of claim 6 in which the first circuit is a digital logic circuit.

8. The integrated semiconductor die of claim 6 in which the second circuit is a digital logic circuit.

9. The integrated circuit semiconductor die of claim 6 in which the first circuit is a digital logic circuit and the second circuit is a digital logic circuit.

10. The integrated circuit semiconductor die of claim 6 in which the first circuit is a digital logic circuit having one logical function and the second circuit is another digital logic circuit having another logical function different than the one logical function.

11. The integrated circuit semiconductor die of claim 6 in which the first strapping structures couple the output of the input circuitry to the input of only the first circuit, and the second strapping structures couple the output of only the first circuit to the input of the output circuitry.

12. The integrated circuit semiconductor die of claim 6 including third strapping circuitry coupling the output of the output circuitry to a bond pad.

13. The integrated circuit semiconductor die of claim 6 in which the input of the input circuitry is coupled to one bond pad and the output of the output circuitry is coupled to another bond pad.

14. The integrated circuit semiconductor die of claim 6 in which the input of the input circuitry is coupled to one bond pad and including third strapping circuitry coupling the output of the output circuitry to another bond pad.

15. An integrated circuit semiconductor die comprising:
   (a) bond pads;
   (b) a first set of circuitry including a first circuit having a first input, a second input, and an output;
   (c) a second set of circuitry including a second circuit having a first input, a second input, and an output;
   (d) input circuitry including a first input circuit having an input coupled to a bond pad and having an output, and including a second input circuit having an input coupled to another bond pad and having an output;
   (e) output circuitry having an input and having an output;
   (f) first strapping structures coupling the output of the first input circuitry to the first input of the first circuit, and coupling the output of the second input circuit to the second input of the first circuit;
   (g) second strapping structures coupling the output of the first circuit to the input of the output circuitry; and
   (h) third strapping circuitry coupling the output of the output circuitry to a bond pad other than the bond pads coupled to the input circuitry.

16. The integrated circuit semiconductor die of claim 15 in which the first circuit is a digital logic circuit.

17. The integrated circuit semiconductor die of claim 15 in which the second circuit is a digital logic circuit.

18. The integrated circuit semiconductor die of claim 15 in which the first circuit is a digital logic circuit and the second circuit is a digital logic circuit.

19. The integrated circuit semiconductor die of claim 15 in which the first circuit is a digital logic circuit having one logical function and the second circuit is another digital logic circuit having another logical function different than the one logical function.

20. The integrated circuit semiconductor die of claim 15 in which the first strapping structures couple the outputs of the input circuitry to the inputs of only the first circuit, and the second strapping structures couple the output of only the first circuit to the input of the output circuitry.

* * * * *